(12) United States Patent
Motoyama

(10) Patent No.: US 7,103,331 B2
(45) Date of Patent: Sep. 5, 2006

(54) LOW NOISE BLOCK DOWN CONVERTER WITH REDUCED POWER CONSUMPTION

(75) Inventor: Koji Motoyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 388 days.

(21) Appl. No.: 10/766,017

(22) Filed: Jan. 29, 2004

(65) Prior Publication Data

US 2004/0192190 A1 Sep. 30, 2004

(30) Foreign Application Priority Data

Mar. 25, 2003 (JP) ............................. 2003-083112
Oct. 31, 2003 (JP) ............................. 2003-372999

(51) Int. Cl.
*H04B 1/04* (2006.01)
*H04B 7/12* (2006.01)
*H04B 7/00* (2006.01)

(52) U.S. Cl. .................. 455/127.1; 455/141; 455/209; 455/255; 455/264; 331/34; 331/175; 370/317; 375/316

(58) Field of Classification Search ............. 455/127.1, 455/127.2, 127.5, 130, 141, 183.1, 189.1, 455/209, 251.1, 255–260, 264–265, 278.1, 455/296, 318, 334, 340
See application file for complete search history.

(56) References Cited

U.S. PATENT DOCUMENTS

| | | | |
|---|---|---|---|
| 5,578,916 A | * | 11/1996 | Muterspaugh ............... 323/267 |
| 6,134,282 A | * | 10/2000 | Ben-Efraim et al. ......... 375/350 |
| 6,600,730 B1 | * | 7/2003 | Davis et al. ................. 370/343 |
| 6,832,071 B1 | * | 12/2004 | Nakamura et al. ......... 455/3.02 |
| 2003/0022644 A1 | | 1/2003 | Imai |

FOREIGN PATENT DOCUMENTS

| | | |
|---|---|---|
| EP | 1 089 469 | 4/2001 |
| EP | 1 096 667 | 5/2001 |
| JP | 5-48480 | 2/1993 |
| JP | 09 153735 | 6/1997 |
| JP | 10-233706 | 9/1998 |

OTHER PUBLICATIONS

International (French) Search Report dated Apr. 4, 2005.

* cited by examiner

*Primary Examiner*—Edward F. Urban
*Assistant Examiner*—Thuan T. Nguyen
(74) *Attorney, Agent, or Firm*—Nixon & Vanderhye, P.C.

(57) ABSTRACT

A power supply circuit of a low noise block converter (LNB) includes a plurality of output voltage regulators. A first output voltage regulator, a local oscillator circuit, a second output voltage regulator, and an LNA are connected in series in a direction in which a power supply current flows. Therefore, a voltage adjustment width of the output voltage regulator can be reduced and a power loss can be reduced. A value of current flowing in the power supply circuit can also be decreased. Accordingly, an LNB with a reduced power consumption can be realized.

12 Claims, 21 Drawing Sheets

LOW NOISE BLOCK DOWN CONVERTER WITH REDUCED POWER CONSUMPTION

BACKGROUND OF THE INVENTION

1. Field of the Invention

The present invention relates to a low noise block down converter (abbreviated as LNB hereinafter) of a satellite broadcast receiver.

2. Description of the Background Art

FIG. 19 is a block diagram showing a configuration of a conventional satellite broadcast receiving system.

Referring to FIG. 19, a signal having a frequency of 11.70 GHz–12.75 GHz coming from a broadcast satellite 801 is received at an antenna 801. Antenna 801 is provided with an LNB 802. LNB 802 frequency-converts weak radio waves coming from the satellite into an IF signal of 1 GHz band, amplifies the signal with low noise, and then supplies the signal to a so-called digital broadcasting (DBS) tuner 804 connected thereto. DBS tuner 804 is supplied with a signal with low noise and at a sufficient level because of the operation of LNB 802.

DBS tuner 804 processes the IF signal supplied from a coaxial cable 803 using an internal circuit and supplies the signal to a television 805.

Radio waves are received at a satellite broadcasting antenna, and the signal is introduced to an indoor DBS tuner normally using a coaxial cable. However, the radio waves received at the antenna cannot be introduced indoors directly with the coaxial cable.

A metal tube called a waveguide is required to introduce the satellite broadcast radio waves having an extremely high frequency. The use of a waveguide is not realistic since a big hole has to be made on the wall to introduce the signal from the antenna to the indoor satellite broadcast receiver and in addition much attenuation occurs.

Therefore, an LNB installed at an antenna is normally used to convert a received signal down enough for a coaxial cable to introduce so that the signal is transmitted to an indoor DBS tuner. The indoor DBS tuner contains a scramble decoder, which descrambles the signal to display an image on a television as a display device.

FIG. 20 is a block diagram of the LNB in FIG. 19.

Referring to FIG. 20, an incoming signal of 12 GHz band is received at an antenna probe 3 in a feed horn 2, is then amplified with low noise in a low noise amplifier (LNA) 5, and thereafter passes through a bandpass filter 910 having a function of passing a desired frequency band and removing a signal of an image frequency band. Thereafter, the signal passed through bandpass filter 910 is mixed by a mixer circuit 11 with a local oscillation signal of 10.6 GHz from a local oscillator circuit 913 and is frequency-converted to an intermediate frequency (IF) signal of the 1 GHz band (1100 MHz–2150 MHz). The output of mixer circuit 11 is amplified in an intermediate frequency amplifier 15 to have appropriate noise characteristic and gain characteristic and is output from an output terminal 34 via a capacitor 17.

Output terminal 34 is supplied with a DC voltage exceeding for example 10V from a tuner arranged indoors via a coaxial cable. This DC voltage is applied to a power supply circuit 936 via a choke coil 32. Power supply circuit 936 down-converts the DC voltage applied from terminal 34 and supplies the voltage as down-converted to a predetermined stabilized voltage to LNA 5, local oscillator circuit 913 and intermediate frequency amplifier 15.

FIG. 21 is a circuit diagram showing a detailed configuration of LNB 900 shown in FIG. 20.

Referring to FIG. 21, power supply circuit 936 includes a voltage regulator 38 converting a DC voltage VS1 applied via choke coil 32 to a stabilized DC voltage VO1, and a multi-output voltage regulator 940 receiving DC voltage VO1 to output DC voltages VO2–VO8 lower than DC voltage VO1 and serving as an operating point of each circuit.

DC voltage VO8 is applied to the gate of a transistor 4 connected to the antenna probe in feed horn 2 as a gate bias voltage. DC voltage VO7 is applied to the drain of transistor 4. The drain of transistor 4 is coupled to the gate of a transistor 8 by a capacitor 6. For example, HEMT (High Electron Mobility Transistor) or the like can be used as the transistor.

Transistor 8 has its gate receiving DC voltage VO6 as a gate bias voltage and has its drain receiving DC voltage VO5.

Local oscillator circuit 913 includes a resistor 18 having its one end receiving DC voltage VO4, a transistor 20 having its collector connected to the other end of resistor 18, having its emitter grounded, and having its base receiving a bias voltage Vbias, and a capacitor 16 for transmitting a signal at the collector of transistor 20.

Mixer circuit 11 includes a transistor 14 receiving at its gate a signal from bandpass filter 10 and a capacitor 24 for transmitting a signal output from the drain of transistor 14 to the next stage. Transistor 14 receives DC voltage VO3 as a gate bias voltage at its gate. Transistor 14 also receives DC voltage VO2 at its drain.

Intermediate frequency amplifier 15 includes an amplifier 26 at the first stage receiving a signal via capacitor 24, a capacitor 28 for transmitting an output of amplifier 26, and a transistor 30 receiving at its base a signal via capacitor 28. DC voltage VO1 output from voltage regulator 38 is supplied to the collector of transistor 30, and the operating current passes from the collector to the emitter of transistor 30, is fed from the emitter to amplifier 26, and flows from amplifier 26 to a ground node.

Conventionally, these circuit elements require respective individual circuit currents, the total of which is a circuit current (consumption current) for a product. In order to reduce the product consumption current, the circuit current for each element has to be reduced or some circuit has to be omitted. However, it is not easy to reduce the consumption current by removing the currently used circuits each having a necessary function.

Therefore, power consumption is reduced by cascading amplifier elements within intermediate frequency amplifier 15 as described above. A prior art document for reducing power consumption in this manner includes Japanese Patent Laying-Open No. 5-48480.

This prior art reduces the consumption current by directly applying a DC voltage, separately from the other units, from an external source to an intermediate frequency amplifier at a lower frequency.

A reduced power consumption is also required in LNB. In the configuration shown in FIG. 21, since DC voltage VO1 output by voltage regulator 38 is a voltage high enough for any of DC voltages VO2–VO8 output by the multi-output voltage regulator, the multi-output voltage regulator needs to down-convert DC voltage VO1 by a considerable potential difference to generate each of these voltages. The down-conversion of the voltage causes much power loss in multi-output voltage regulator 940.

SUMMARY OF THE INVENTION

An object of the present invention is to provide a low noise block down converter with reduced power loss and reduced power consumption.

In summary, the present invention provides a low noise block down converter including: a signal reception unit receiving a broadcast signal transmitted from a first satellite to output a first RF signal; a local oscillator circuit receiving a supply of power supply current from a high potential node to discharge the power supply current from a low potential node; a frequency converter converting the first RF signal into a first IF signal of an intermediate frequency band using an output signal of the local oscillator circuit; an output port for outputting the first IF signal; and a power supply circuit supplying power to the local oscillator circuit and the first signal reception unit. The power supply circuit includes a first voltage regulator receiving a power supply via the output port to perform a voltage adjustment and applying a first DC voltage to the high potential node of the local oscillator circuit, and a second voltage regulator receiving a potential at the low potential node of the local oscillator circuit to perform a voltage adjustment and applying a second DC voltage to the signal reception unit.

Preferably, the local oscillator circuit includes a plurality of local oscillators respectively outputting a plurality of local oscillation signals.

More preferably, the power supply circuit includes a switch selectively supplying the first DC voltage to the plurality of local oscillators.

Preferably, the signal reception unit includes a plurality of low noise amplifiers respectively receiving a plurality of broadcast signals.

More preferably, the power supply circuit includes a switch selectively supplying the second DC voltage to the plurality of low noise amplifiers.

Preferably, the local oscillator circuit includes a transistor receiving a base bias voltage that is higher than an output target voltage of the second voltage regulator at least by a base-emitter voltage.

In accordance with another aspect of the present invention, a low noise block down converter includes: a signal reception unit receiving a supply of power supply current from a high potential node to discharge the power supply current from a low potential node and receiving a broadcast signal transmitted from a first satellite to output a first RF signal; a local oscillator circuit; a frequency converter converting the first RF signal into a first IF signal of an intermediate frequency band using an output signal of the local oscillator circuit; an output port for outputting the first IF signal; and a power supply circuit supplying power to the local oscillator circuit and the first signal reception unit. The power supply circuit includes a first voltage regulator receiving a power supply via the output port to perform a voltage adjustment and applying a first DC voltage to the high potential node of the signal reception unit, and a second voltage regulator receiving a potential at the low potential node of the signal reception unit to perform a voltage adjustment and applying a second DC voltage as a power supply voltage to the local oscillator circuit.

Preferably, the local oscillator circuit includes a plurality of local oscillators respectively outputting a plurality of local oscillation signals.

More preferably, the power supply circuit includes a switch selectively supplying the second DC voltage to the plurality of local oscillators.

Preferably, the signal reception unit includes a plurality of low noise amplifiers respectively receiving a plurality of broadcast signals.

More preferably, the power supply circuit includes a switch selectively supplying the first DC voltage to the plurality of low noise amplifiers.

Preferably, the local oscillator circuit includes a transistor receiving a base bias voltage that is higher than that of a ground node at least by a base-emitter voltage.

Therefore, a main advantage of the present invention is to reduce a potential difference to be adjusted for each voltage regulator and thus to reduce a power loss in the voltage regulator by providing a plurality of voltage regulators and internal circuits in series on the power supply current path as well as to reduce the total power supply current of the power supply current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
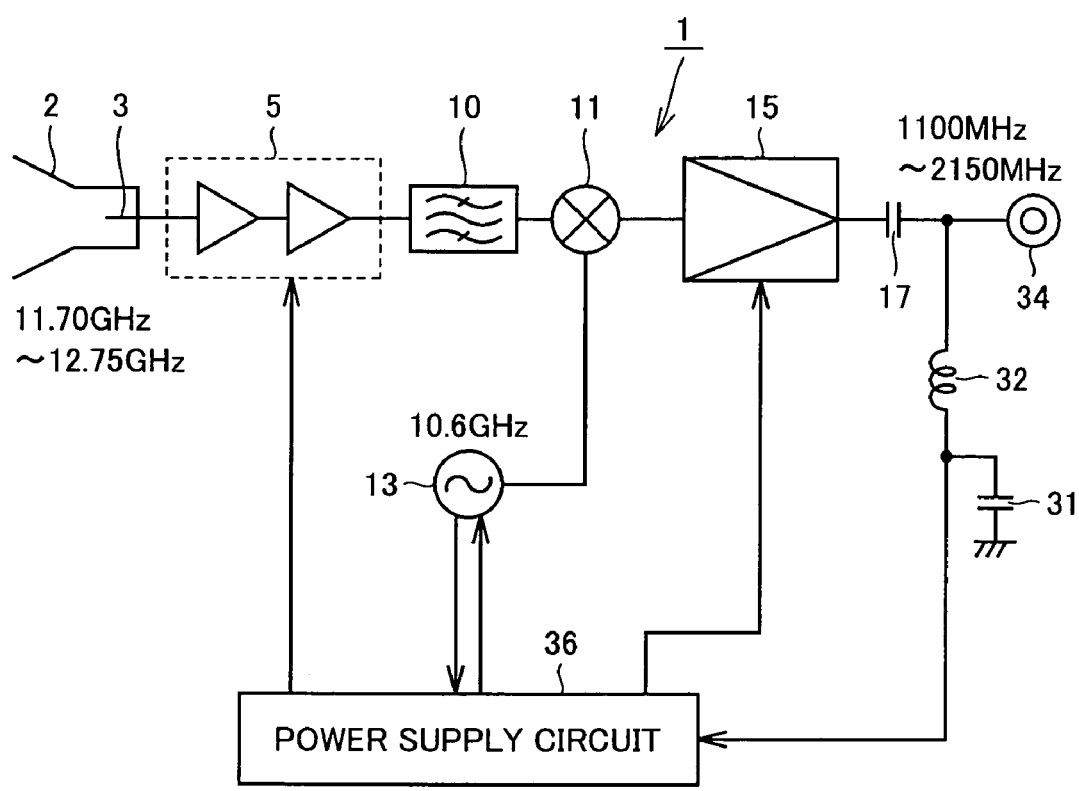
FIG. 1 is a block diagram showing a configuration of an LNB 1 of a first embodiment of the present invention.

In the following, the embodiments of the present invention will be described with reference to the figures. It is noted that in the figures the same or corresponding parts will be denoted with the same reference characters.

First Embodiment

FIG. 1 is a block diagram showing a configuration of an LNB 1 of a first embodiment of the present invention.

Referring to FIG. 1, LNB 1 includes a feed horn 2 receiving a broadcast signal transmitted from a satellite, an antenna probe 3 arranged within feed horn 2, an LNA 5 low noise amplifying the signal received from antenna probe 3, and a bandpass filter 10 limiting the band of the output signal of LNA 5 to remove a signal of an image frequency band.

LNB 1 further includes a local oscillator circuit 13 outputting a local oscillation signal of 10.6 GHz, a mixer circuit 11 receiving the local oscillation signal from local oscillator circuit 13 to mix the local oscillation signal with an output signal of bandpass filter 10, an intermediate frequency amplifier 15 amplifying the received signal converted to an intermediate frequency by mixer circuit 11, and a capacitor 17 for transmitting an output of intermediate frequency amplifier 15 to a terminal 34.

LNB 1 further includes a choke coil 32 for transmitting a DC voltage supplied from a tuner arranged indoors via terminal 34 and blocking transmittance of the output signal from intermediate frequency amplifier 15, and a power supply circuit 36 receiving the DC voltage via choke coil 32 to apply necessary power supply current and bias voltage to LNA 5, local oscillator circuit 13 and intermediate frequency amplifier 15. A capacitor 31 is connected at a node between choke coil 32 and power supply circuit 36 for noise elimination.

Unlike the conventional, power supply circuit 36 supplies current to local oscillator circuit 13 and receives again the current flowing out of local oscillator circuit 13 to supply a stabilized current to LNA 5.

Figure 2:
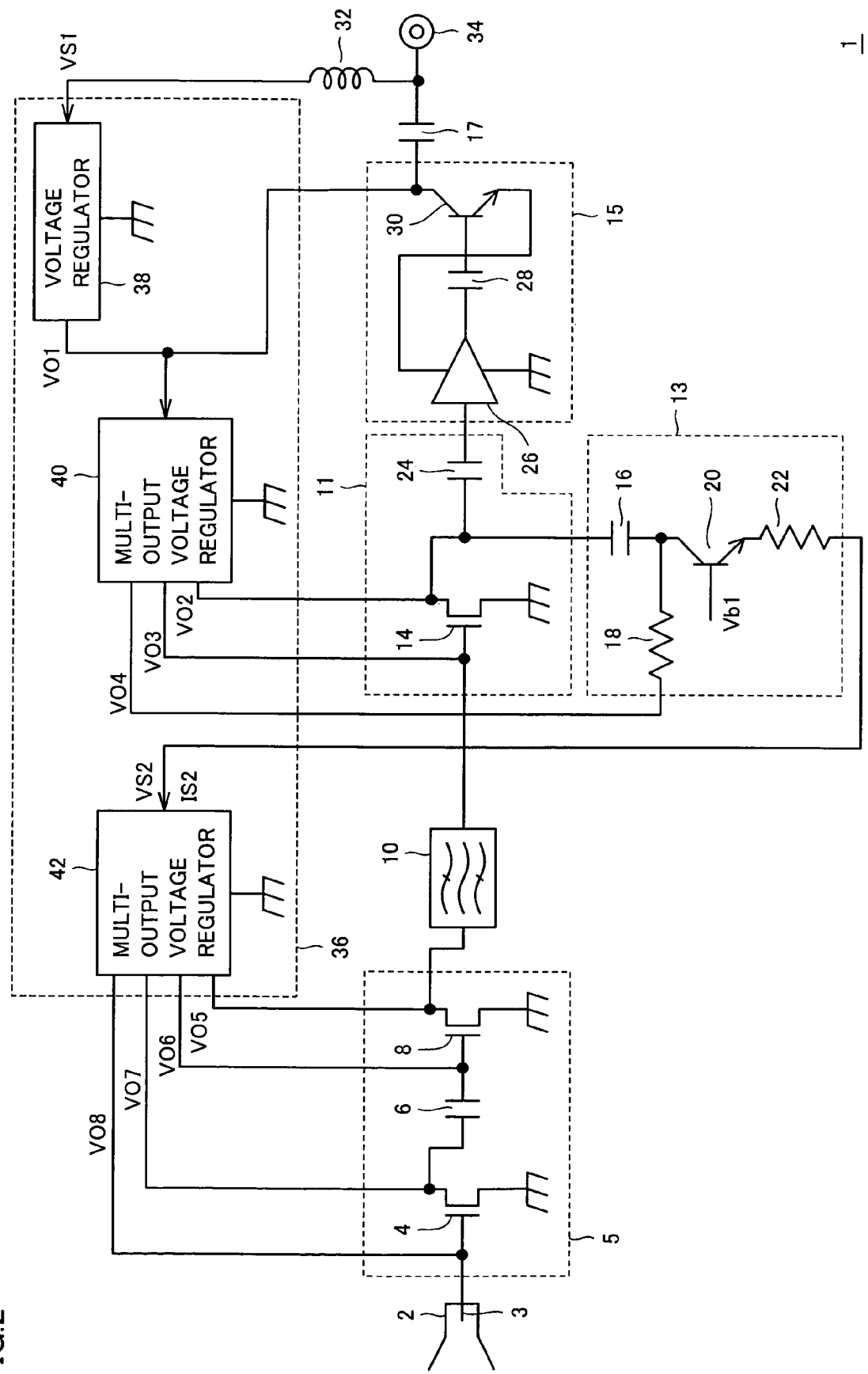
FIG. 2 is a circuit diagram more specifically showing the configuration of LNB 1 shown in FIG. 1.

FIG. 2 is a circuit diagram more specifically showing the configuration of LNB 1 shown in FIG. 1.

Referring to FIG. 2, LNA 5 includes transistors 4 and 8 corresponding to a first-stage amplifier and a second-stage amplifier, respectively, and a capacitor 6 connected between the drain of transistor 4 and the gate of transistor 8.

Transistor 4 receives at its gate a signal received at antenna probe 3 provided within feed horn 2. Transistor 4 also receives at its gate DC voltage VO8 as a gate bias potential from power supply circuit 36. Transistor 4 has its drain receiving DC voltage VO7 from power supply circuit 36 and has its source connected to a ground node.

Transistor 8 has its gate receiving DC voltage VO6 serving as a bias potential and has its drain receiving DC voltage VO5. Transistor 8 has its source connected to the ground node. Bandpass filter 10 limits the band of the signal output from the drain of transistor 8 to remove a signal of the image frequency band.

Local oscillator circuit 13 includes resistors 18 and 22, a capacitor 16, and a transistor 20. Resistor 18 has one end receiving DC voltage VO4 from power supply circuit 36 and the other end connected to the collector of transistor 20. Transistor 20 has its emitter connected to one end of resistor 22, and resistor 22 has the other end connected to power supply circuit 36.

Mixer circuit 11 includes a transistor 14 and a capacitor 24. Transistor 14 receives at its gate a signal output from bandpass filter 10 and receives DC voltage VO3 supplied as a bias voltage from power supply circuit 36. Transistor 14 receives at its drain DC voltage VO2 from power supply circuit 36. Transistor 14 has its drain AC-coupled with the collector of transistor 20 through capacitor 16. Therefore, the local oscillation frequency is mixed with the signal of bandpass filter 10 to be output via capacitor 24.

Intermediate frequency amplifier 15 includes a first-stage amplifier 26, a transistor 30 further amplifying the output of amplifier 26, and a capacitor 28 coupling the output of amplifier 26 to the base of transistor 30.

Power supply circuit 36 includes a voltage regulator 38 receiving DC voltage VS1 applied from terminal 34 via choke coil 32 to output the stabilized DC voltage VO1, a multi-output voltage regulator 40 receiving DC voltage VO1 to output DC voltages VO2–VO4, and a multi-output voltage regulator 42 outputting DC voltages VO5–VO8 stabilized from DC voltage VS2.

The DC voltage output by voltage regulators 40, 42 is output to the other circuit, serving as a base bias voltage or a voltage to determine an operating point of output of the transistor. Voltage regulators 40, 42 appropriately place current-limiting on each of the outputs for an appropriate amplification operation in each transistor.

In intermediate frequency amplifier 15, transistor 30 is cascaded to amplifier 26 on the current path. In other words, the current supplied from voltage regulator 38 flows from the collector to the emitter of transistor 30. The current flowing out of the emitter further flows into the power supply node of amplifier 26, passes through amplifier 26, and flows to the ground node.

Such a cascade connection is provided between local oscillator circuit 13 and LNA 5. The operating power supply current of local oscillator circuit 13 is supplied from a node at which multi-output voltage regulator 40 outputs DC voltage VO4 to pass through resistor 18 and flow from the collector to the emitter of transistor 20. The current flowing out of the emitter is supplied through resistor 22 to the multi-output voltage regulator. This multi-output voltage regulator is supplied with current IS2 and voltage VS2 via resistor 22. These voltage VS2 and current IS2 are also adjusted in the input circuit portion of voltage regulator 42. Bias voltage Vb1 in FIG. 2 is set at a voltage higher than bias voltage Vbias in the conventional circuit shown in FIG. 21.

Multi-output voltage regulator 42 receives current IS2 and voltage VS2 to stabilize the same and output DC voltages VO5–VO8 to LNA 5.

It is noted that a stub or choke coil formed of a pattern on a printed circuit board is provided between each output of multi-output voltage regulator 40 and mixer circuit 11 or local oscillator circuit 13 for blocking a received signal or local oscillation signal from being transmitted to the output of the multi-output voltage regulator.

Similarly, a stub or choke coil formed of a pattern on a printed circuit board or the like is provided between each output of multi-output voltage regulator 42 and LNA for blocking a high-frequency received signal from being transmitted to multi-output voltage regulator 42. It is noted that such a stub or choke coil is not shown in the drawing for the sake of simplification.

The voltage regulator is also called a series regulator. Generally, a voltage regulator needs to apply an input voltage higher than a voltage required by a load. The voltage regulator also acts to consume an excessive voltage in order to always supply a constant output voltage. Therefore, the greater the adjustment width, the greater the power loss in the voltage regulator becomes.

Figure 21:
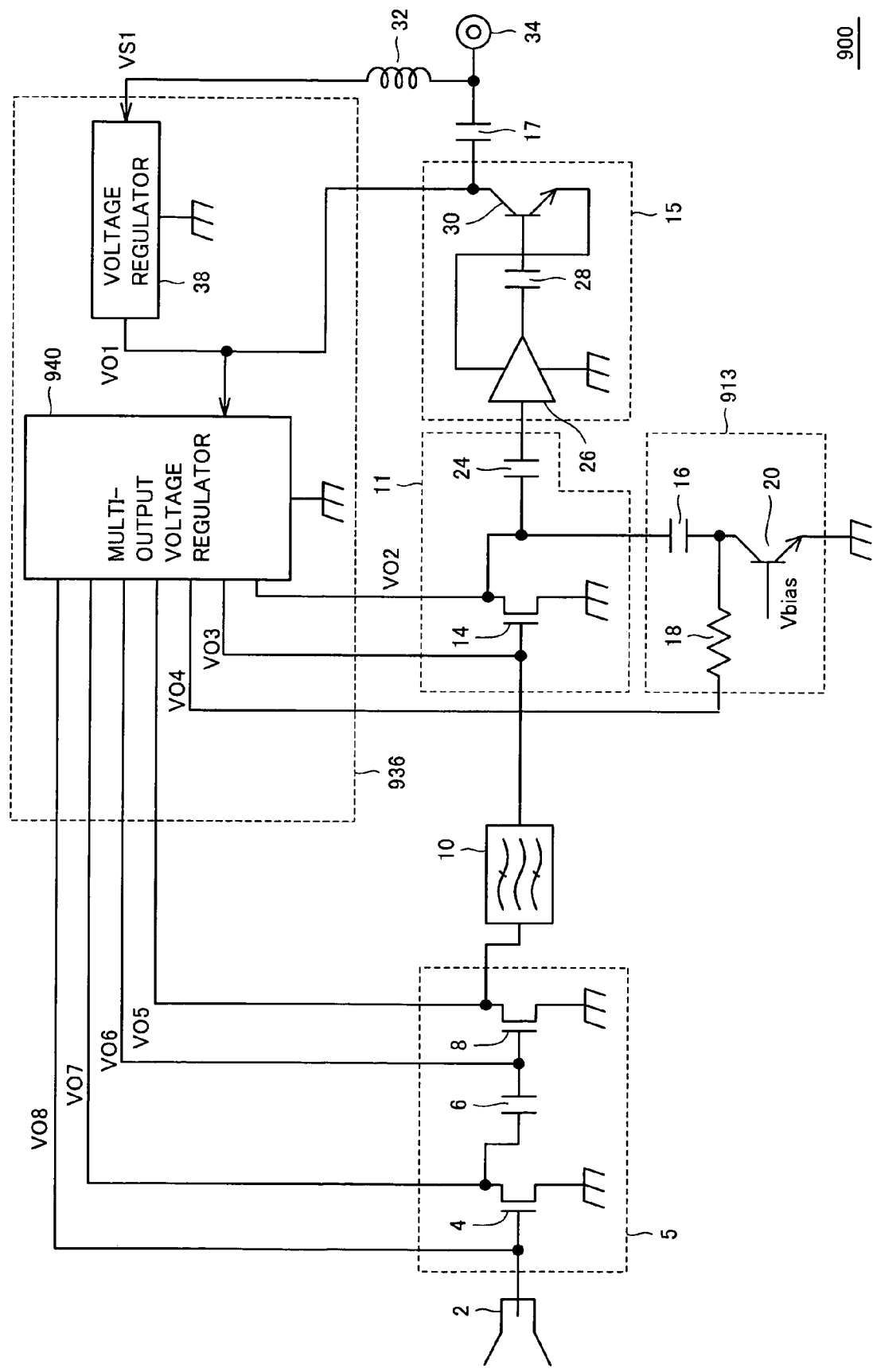
FIG. 21 is a circuit diagram showing a detailed configuration of LNB 900 shown in FIG. 20.

As compared with the conventional technique shown in FIG. 21, multi-output voltage regulator 42 generates DC voltages VO5–VO8 from voltage VS2 lower than DC voltage VO1 and therefore can generate a stable DC voltage with less power loss. In the conventional configuration, the sum of the current flowing in local oscillator circuit 913 and the current flowing in LNA 5 accounts for a part of the entire consumption current. With the configuration of the first embodiment, if the current flowing in local oscillator circuit 13 is substantially equal to the current flowing in LNA 5, the consumption current in these portions can be reduced to approximately half in current value.

If there is a difference between the consumption current in local oscillator circuit 13 and the consumption current in LNA 5, power supply circuit 36 may additionally include a circuit for sourcing a supplemental current or a circuit for sinking an excessive current at the node of multi-output voltage regulator 42 receiving voltage VS2.

Second Embodiment

Figure 3:
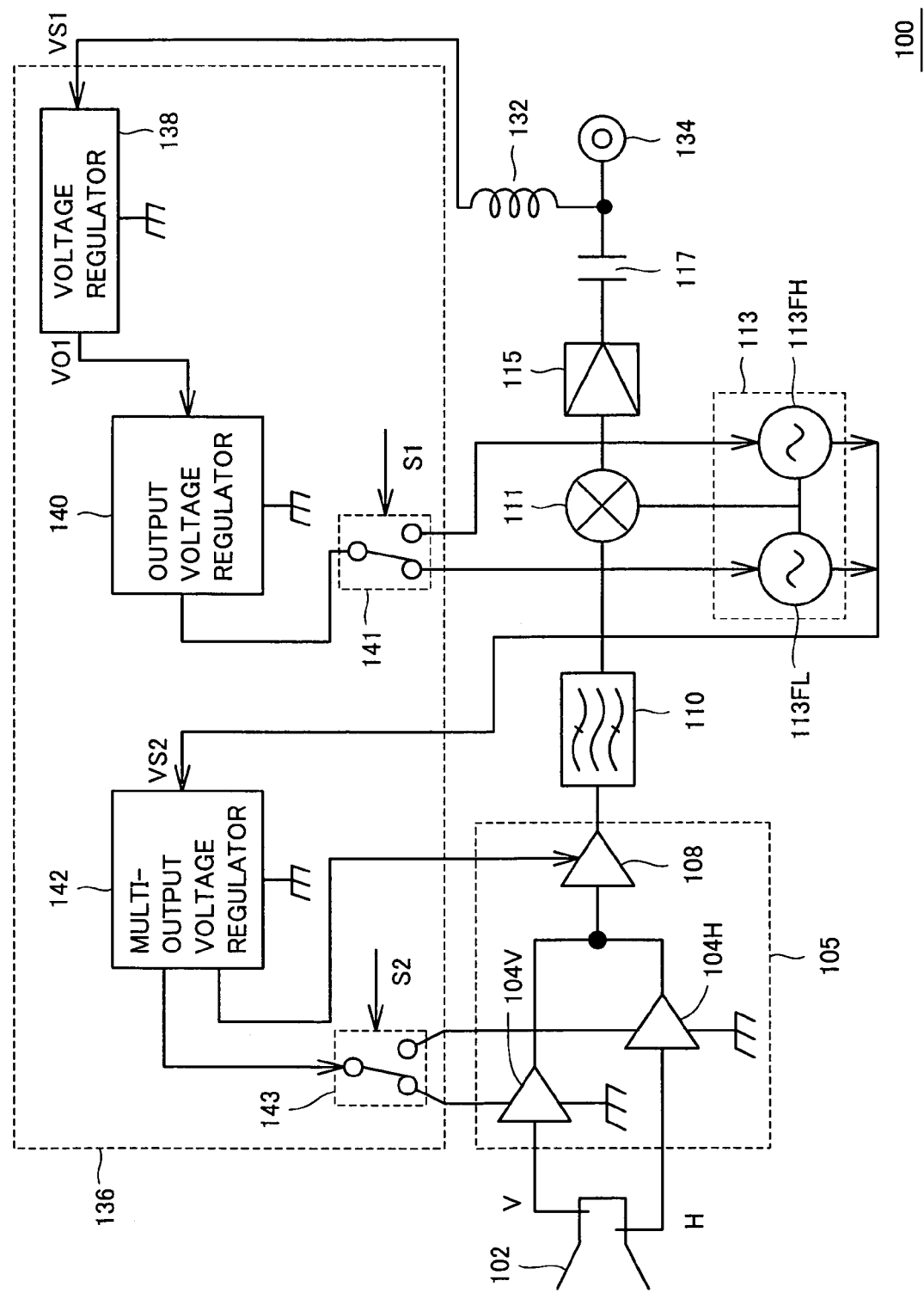
FIG. 3 is a block diagram showing a configuration of an LNB 100 of a second embodiment.

FIG. 3 is a block diagram showing a configuration of an LNB 100 of a second embodiment.

Referring to FIG. 3, LNB 100 includes a feed horn 102, an LNA 105 selectively amplifying a V polarized wave signal and an H polarized wave signal provided from feed horn 102, a bandpass filter 110 limiting the band of output of LNA 105, a local oscillator circuit 113, a mixer circuit 111 mixing a local oscillation signal supplied from local oscillator circuit 113 with an output of bandpass filter 110 for conversion into an intermediate frequency, an intermediate frequency amplifier 115 amplifying an output of mixer circuit 111, and a capacitor 117 coupled between the output of intermediate frequency amplifier 115 and a terminal 134.

LNB 100 further includes a choke coil 132 for transmitting a DC voltage applied from an indoor tuner to terminal 134, and a power supply circuit 136 receiving DC voltage VS1 via choke coil 132 to power LNA 105 and local oscillator circuit 113.

LNA 105 includes an amplifier circuit 104V amplifying a V polarized wave, an amplifier circuit 104H amplifying an H polarized wave, and an amplifier circuit 108 having its input coupled to the outputs of amplifier circuits 104V and 104H.

Local oscillator circuit 113 includes a local oscillator 113FL outputting a first local oscillation signal and a local oscillator 113FH outputting a second local oscillation signal having a frequency higher than that of local oscillator 113FL.

Power supply circuit 136 includes a voltage regulator 138 outputting DC voltage VO1 stabilized from DC voltage VS1, an output voltage regulator 140 receiving the output of voltage regulator 138 to output DC voltage VO2 stabilized at an appropriate voltage, and a switch 141 selectively applying the output voltage of output voltage regulator 140 to one of local oscillator 113FL and local oscillator 113FH according to a select signal S1.

Power supply circuit 136 further includes a multi-output voltage regulator 142 receiving DC voltage VS2 from local oscillator circuit 113 to apply the stabilized voltage to LNA105, and a switch 143 selectively applying the output of multi-output voltage regulator 142 to one of amplifier circuits 104V and 104H according to a select signal S2.

Select signal S2 is controlled based on whether the indoor tuner receives a V polarized wave or an H polarized wave.

Select signal S1 is selected depending on how the output of bandpass filter 110 is frequency-converted, that is, a high or low frequency. Select signals S1 and S2 allow the operating voltage and operating current to be supplied only to a necessary circuit, thereby reducing the consumption current of the LNB.

Furthermore, since output voltage regulators 140 and 142 are connected in series through a local oscillator circuit on the path on which the power supply current flows, the LNB with switching between H polarized wave and V polarized wave as well as switching of the local oscillator circuit between high and low frequencies can also attain less power loss in the power supply circuit, thereby further reducing the power consumption.

Third Embodiment

Figure 4:
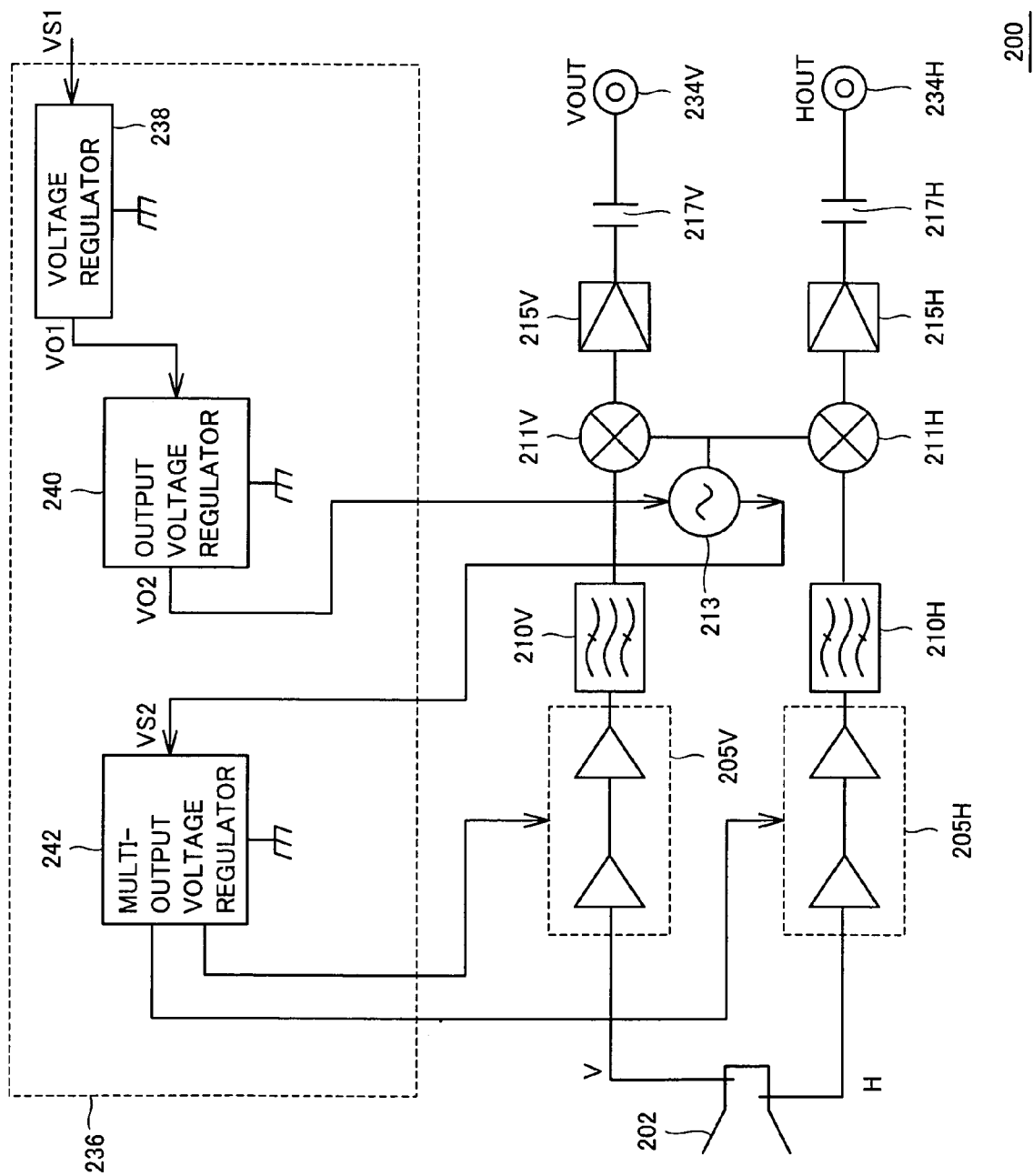
FIG. 4 is a block diagram showing a configuration of an LNB 200 of a third embodiment.

FIG. 4 is a block diagram showing a configuration of an LNB 200 of a third embodiment.

Referring to FIG. 4, LNB 200 includes a feed horn 202 receiving a signal from a satellite, an LNA 205V amplifying a V polarized wave signal received by feed horn 202, a bandpass filter 210V removing an image signal from an output of LNA 205V, a local oscillator 213, a mixer circuit 211V mixing a local oscillation signal output by local oscillator 213 with an output of bandpass filter 210V, an intermediate frequency amplifier 215V amplifying an IF signal of an intermediate frequency band output from mixer circuit 211V, and a capacitor 217V for transmitting an output of intermediate frequency amplifier 215V to a terminal 234V.

LNB 200 further includes an LNA 205H amplifying an H polarized wave signal received by feed horn 202, a bandpass filter 210H removing an image signal from an output of LNA 205H, a mixer circuit 211H mixing a local oscillation signal output by local oscillator 213 with an output of bandpass filter 210H, an intermediate frequency amplifier 215H amplifying an IF signal of an intermediate frequency band output from mixer circuit 211H, and a capacitor 217H for transmitting an output of intermediate frequency amplifier 215H to a terminal 234H.

LNB 200 further includes a power supply circuit 236. Power supply circuit 236 includes a voltage regulator 238 receiving DC power supply voltage VS1 to stabilize the same and output voltage VO1, an output voltage regulator 240 down-converting and further stabilizing an output of voltage regulator 238 to output voltage VO2 to local oscillator 213, and a multi-output voltage regulator 242 receiving DC voltage VS2 from local oscillator 213 to supply the stabilized voltage to LNA 205V and 205H. It is noted that voltage VS1 can be obtained from two terminals by interposing respective backflow-preventing diodes for terminals 234V and 234H.

In the configuration in FIG. 4, LNA 205V and 205H as well as local oscillator 213 continuously operate, and terminals 234V and 234H output a signal converted from V polarized wave and a signal converted from H polarized wave, respectively.

Figure 5:
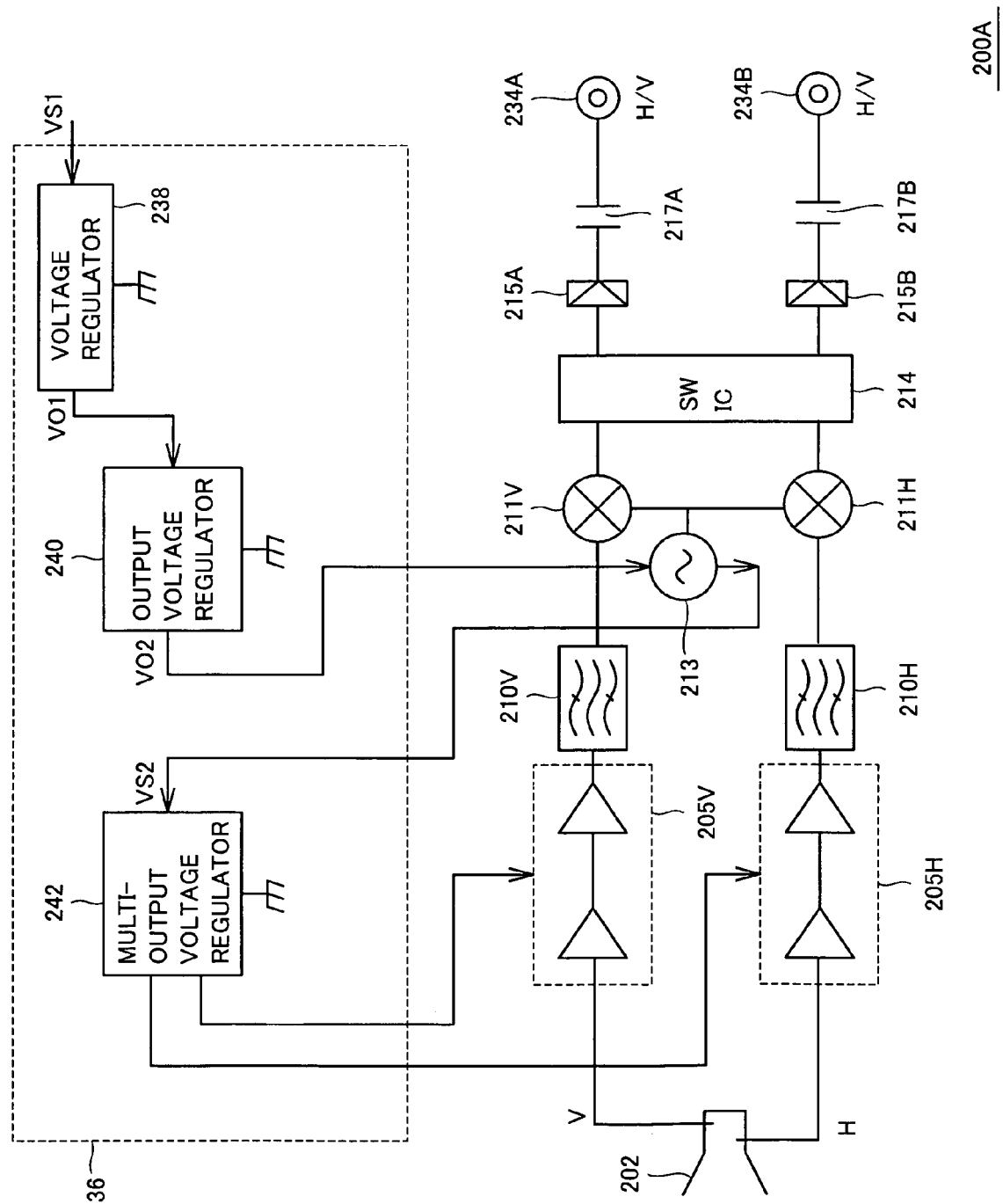
FIG. 5 is a diagram showing a modification of LNB 200 shown in FIG. 4.

FIG. 5 is a diagram showing a modification of LNB 200 shown in FIG. 4.

Referring to FIG. 5, an LNB 200A has the same configuration as LNB 200 shown in FIG. 4 except that intermediate frequency amplifiers 215V and 215H, capacitors 217V and 217H, and terminals 234V and 234H are replaced with a switch IC (Integrated Circuit) 214, intermediate frequency amplifiers 215A and 215B, capacitors 217A and 217B, and terminals 234A and 234B. The configuration in the other portion of LNB 200A is similar to that of LNB 200 as described with reference to FIG. 4 and therefore description thereof will not be repeated.

LNB 200A uses internal switching at switch IC214 to allow both of the outputs of mixer circuits 211V and 211H to be supplied to intermediate frequency amplifier 215A. Therefore, terminal 234A can output either of a signal converted from H polarized wave and a signal converted from V polarized wave.

Similarly, LNB 200A uses internal switching at switch IC 214 to allow both of the outputs of mixer circuits 211V and 211H to be selectively output to intermediate frequency amplifier 215B. Terminal 234B can also output either of a signal converted from H polarized wave and a signal converted from V polarized wave.

Also in the configuration shown in FIGS. 4 and 5, output voltage regulator 240, local oscillator 213, multi-output voltage regulator 242 and LNA 205V and 205H are connected in series on the path on which the power supply current flows. Therefore, the adjustment potential difference in output voltage regulators 240 and 242 can be kept small to reduce a power loss. Therefore, an LNB with a reduced power consumption can be realized.

Fourth Embodiment

Figure 6:
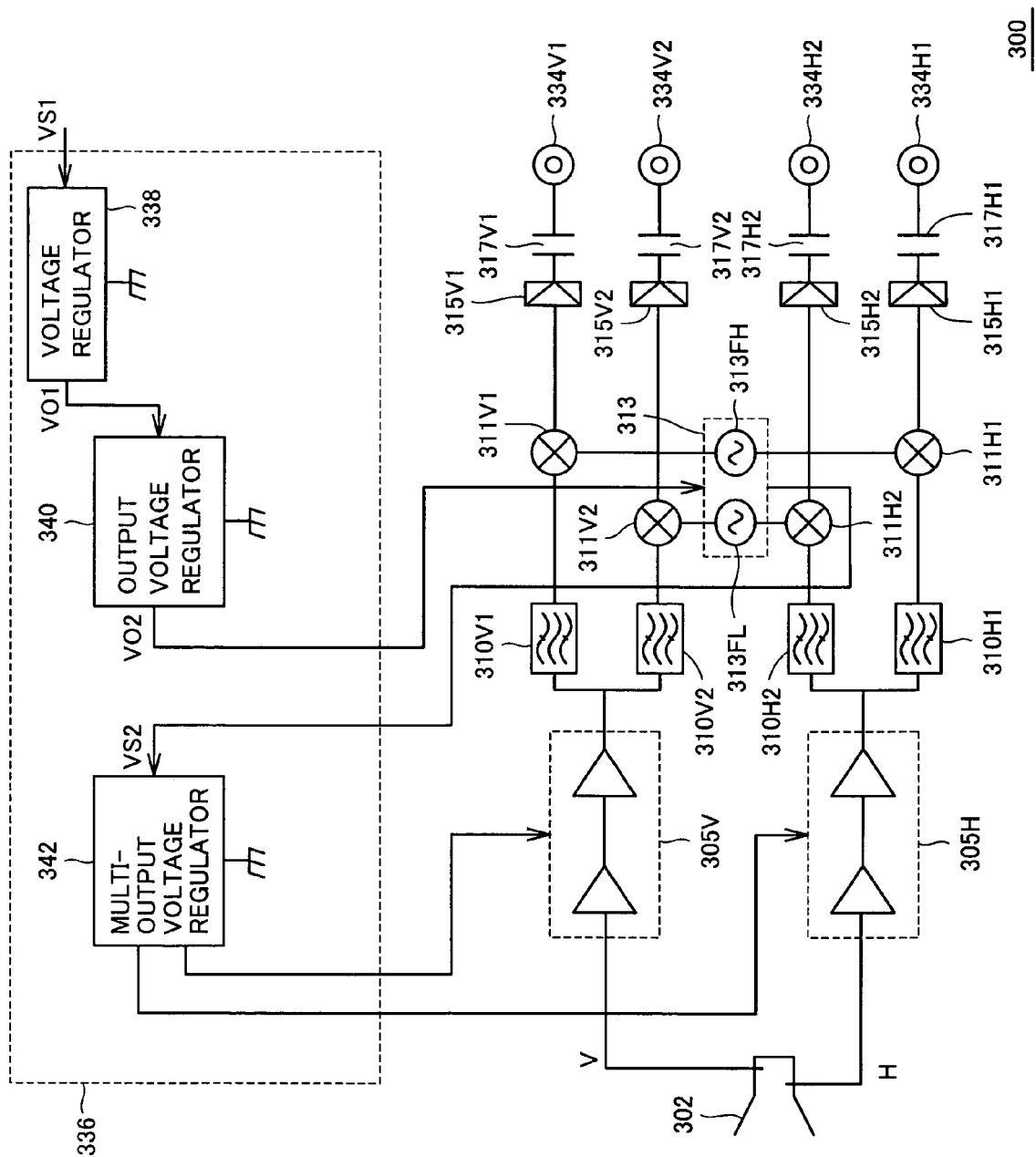
FIG. 6 is a block diagram showing a configuration of an LNB 300 of a fourth embodiment.

FIG. 6 is a block diagram showing a configuration of an LNB 300 of a fourth embodiment.

Referring to FIG. 6, LNB 300 includes a feed horn 302, an LNA 305V amplifying a V polarized wave received at feed horn 302, bandpass filters 310V1 and 310V2 removing an image signal from an output of LNA 305V, and local oscillator circuit 313.

Local oscillator circuit 313 includes a local oscillator 313FH and a local oscillator 313FL outputting an oscillation signal having a frequency lower than that of local oscillator 313FH.

LNB 300 further includes a mixer circuit 311V1 mixing an output of local oscillator 313FH with an output of bandpass filter 310V1 for conversion into an intermediate frequency, an intermediate frequency amplifier 315V1 amplifying the intermediate frequency output by mixer circuit 311V1, and a capacitor 317V1 for transmitting an output of intermediate frequency amplifier 315V1 to a terminal 334V1.

LNB 300 further includes a mixer circuit 311V2 mixing an output of local oscillator 313FL with an output of bandpass filter 310V2 for conversion into an intermediate frequency, an intermediate frequency amplifier 315V2 amplifying the intermediate frequency output by mixer circuit 311V2, and a capacitor 317V2 for transmitting an output of intermediate frequency amplifier 315V2 to a terminal 334V2.

LNB 300 further includes an LNA 305H amplifying an H polarized wave received at feed horn 302, bandpass filters 310H1 and 310H2 removing an image signal from an output of LNA 305H, and local oscillator circuit 313.

LNB 300 further includes a mixer circuit 311H2 mixing an output of local oscillator 313FL with an output of bandpass filter 310H2 for conversion into an intermediate frequency, an intermediate frequency amplifier 315H2 amplifying the intermediate frequency output by mixer circuit 311H2, and a capacitor 317H2 for transmitting an output of intermediate frequency amplifier 315H2 to a terminal 334H2.

LNB 300 further includes a mixer circuit 311H1 mixing an output of local oscillator 313FH with an output of bandpass filter 310H1, an intermediate frequency amplifier 315H1 amplifying the intermediate frequency output by mixer circuit 311H1, and a capacitor 317H1 for transmitting an output of intermediate frequency amplifier 315H1 to a terminal 334H1.

LNB 300 further includes a power supply circuit 336. Power supply circuit 336 includes a voltage regulator 338 receiving DC power supply voltage VS1 to stabilize the same and output voltage VO1, an output voltage regulator 340 down-converting and further stabilizing the output of voltage regulator 338 to output voltage VO2 to local oscillator circuit 313, and a multi-output voltage regulator 342 receiving DC voltage VS2 from local oscillator circuit 313 to supply the stabilized voltage to LNA 305V and 305H. It is noted that voltage VS1 can be obtained from four terminals by interposing respective backflow-preventing diodes for terminals 334V1, and 334H1, 334V2, and 334H2.

Figure 7:
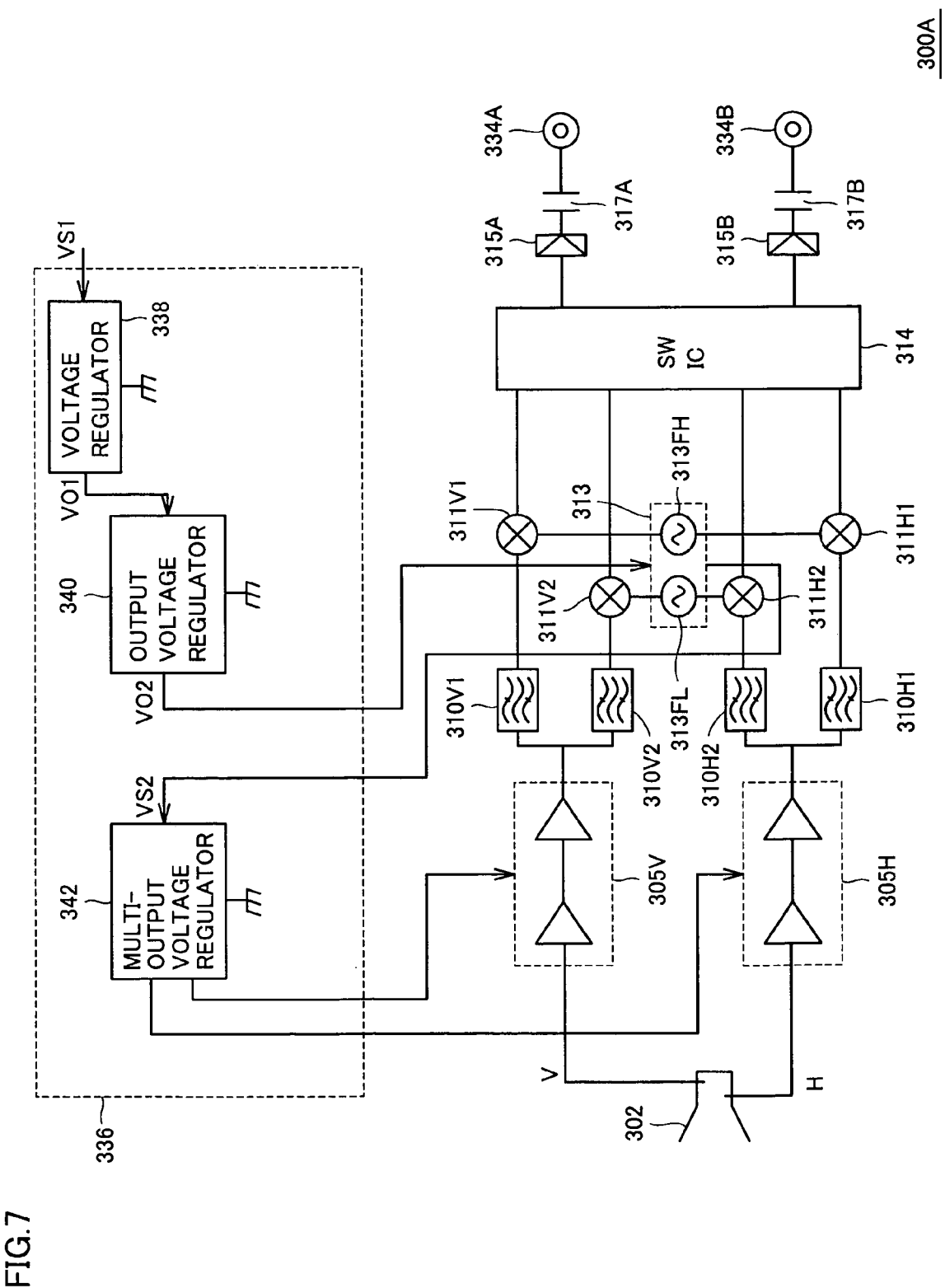
FIG. 7 is a diagram showing a modification of the LNB shown in FIG. 6.

FIG. 7 is a modification of the LNB shown in FIG. 6.

Referring to FIG. 7, an LNB 300A has the same configuration as LNB 300 except that intermediate frequency amplifiers 315V1, 315V2, 315H2 and 315H1, capacitors 317V1, 317V2, 317H2, and 317H1 as well as terminals 334V1, 334V2, 334H2, and 334H1 are replaced with a switch IC314, intermediate frequency amplifiers 315A and 315B, capacitors 317A and 317B as well as terminals 334A and 334B. The configuration of the other portion of LNB 300A is similar to that of LNB 300 as described with reference to FIG. 6 and therefore description thereof will not be repeated.

Switch IC 314 selects one of the outputs of four mixer circuits 311V1, 311V2, 311H2 and 311H1 to apply a selected one to intermediate frequency amplifier 315A. Similarly, switch IC 314 selects one of the outputs of the four mixer circuits to apply a selected one to intermediate frequency amplifier 315B. Therefore, both of terminal 334A and terminal 334B each can output four kinds of signals.

Also in the configuration shown in FIGS. 6 and 7, output voltage regulator 340, local oscillator circuit 313, multi-output voltage regulator 342, and LNA 305V and 305H are connected in series on the path on which the power supply current flows. Therefore, the adjustment potential difference in output voltage regulators 340 and 342 can be kept small to reduce a power loss. Accordingly, an LNB with a reduced power consumption can be realized.

Fifth Embodiment

Figure 8:
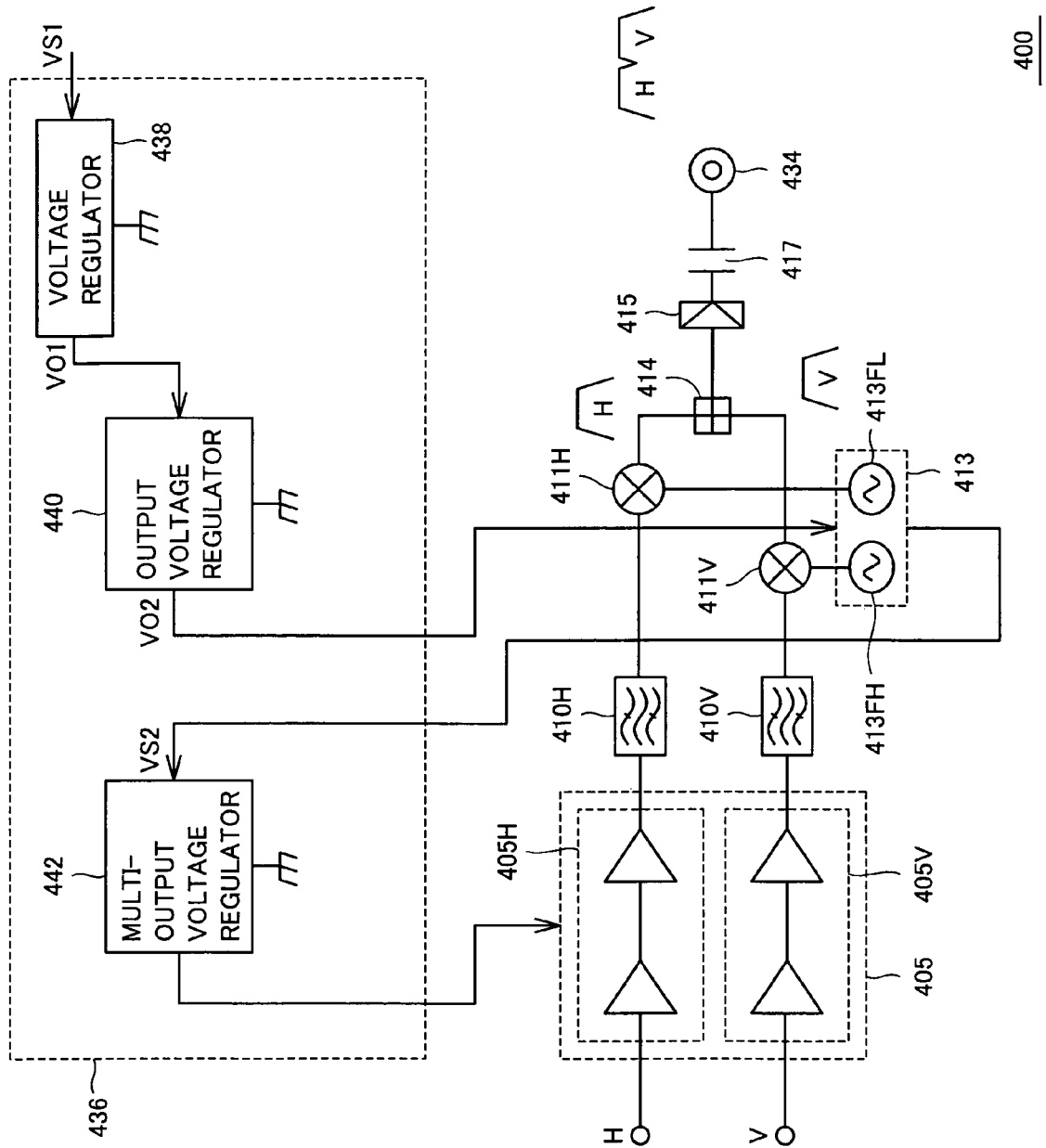
FIG. 8 is a block diagram showing a configuration of an LNB 400 of a fifth embodiment.

FIG. 8 is a block diagram showing a configuration of an LNB 400 of a fifth embodiment.

LNB 400 shown in FIG. 8 is a band stack type LNB. The band stack type LNB is an LNB for frequency-converting a plurality of received signals of H polarized wave and V polarized wave such that they are not overlapped in the intermediate frequency band to transmit the signals indoors on one signal cable.

LNB 400 includes an LNA 405 including an LNA 405H amplifying an H polarized wave and an LNA 405V amplifying a V polarized wave.

LNB 400 further includes a bandpass filter 410H removing an image signal from an output of LNA 405H, a bandpass filter 410V removing an image signal from an output of LNA 405V, and a local oscillator circuit 413.

Local oscillator circuit 413 includes a local oscillator 413FH and a local oscillator 413FL outputting an oscillation signal having a frequency lower than that of local oscillator 413FH.

LNB 400 further includes a mixer circuit 411H mixing an output of local oscillator 413FL with an output of bandpass filter 410H for conversion into an intermediate frequency, a mixer circuit 411V mixing an output of local oscillator 413FH with an output of bandpass filter 410V for conversion into an intermediate frequency, a mixer circuit 414 mixing an output of mixer circuit 411H with an output of mixer circuit 411V, an intermediate frequency amplifier 415 amplifying an output of mixer circuit 414, and a capacitor 417 for transmitting an output of intermediate frequency amplifier 415 to a terminal 434.

LNB 400 further includes a power supply circuit 436. Power supply circuit 436 includes a voltage regulator 438 receiving and stabilizing DC power supply voltage VS1 to output voltage VO1, an output voltage regulator 440 down-converting and further stabilizing an output of voltage regulator 438 to output voltage VO2 to local oscillator circuit 413, and a multi-output voltage regulator 442 receiving DC voltage VS2 from local oscillator circuit 413 to supply the stabilized voltage to LNA 405V and 405H. It is noted that voltage VS1 can be obtained from terminal 434 by interposing a choke coil for blocking transmittance of a high frequency signal.

Also in the configuration shown in FIG. 8, output voltage regulator 440, local oscillator circuit 413, multi-output voltage regulator 442, and LNA 405V and 405H are connected in series on the path on which the power supply current flows. Therefore, the adjustment potential difference in output voltage regulators 440 and 442 can be kept small to reduce a power loss. Accordingly, an LNB with a reduced power consumption can be realized.

Sixth Embodiment

Figure 9:
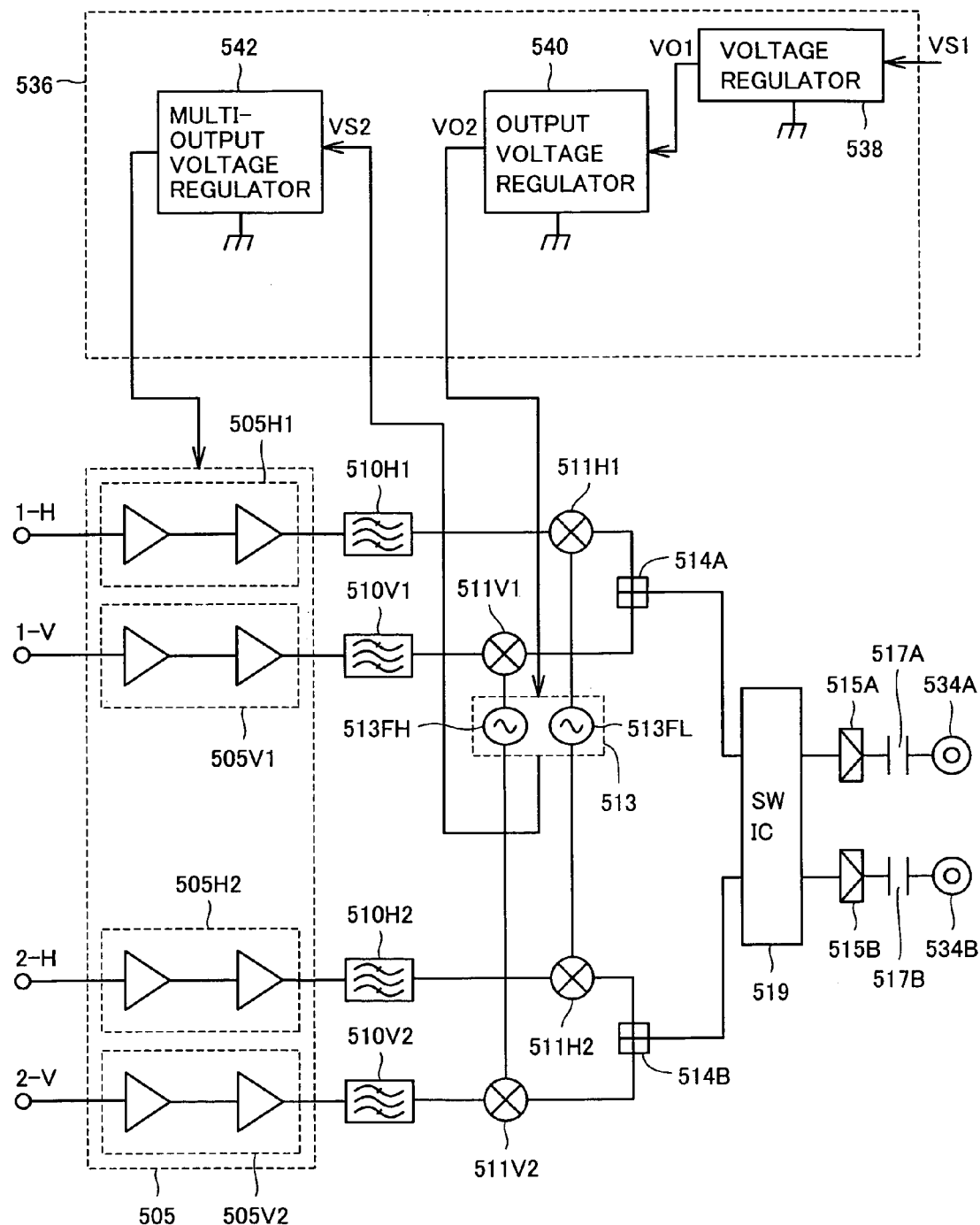
FIG. 9 is a block diagram showing a configuration of an LNB 500 of a sixth embodiment.

FIG. 9 is a block diagram showing a configuration of an LNB 500 of a sixth embodiment.

Referring to FIG. 9, LNB 500 includes an LNA 505. LNA 505 includes an LNA 505H1 amplifying an H polarized wave of a first satellite, an LNA 505V1 amplifying a V polarized wave of the first satellite, an LNA 505H2 amplifying an H polarized wave of a second satellite, and an LNA 505V2 amplifying a V polarized wave of the second satellite.

LNB 500 further includes a bandpass filter 510H1 removing an image signal from an output of LNA 505H1, a bandpass filter 510V1 removing an image signal from an output of LNA 505V1, and a local oscillator circuit 513.

Local oscillator circuit 513 includes a local oscillator 513FH and a local oscillator 513FL outputting an oscillation signal having a frequency lower than that of local oscillator 513FH.

LNB 500 further includes a mixer circuit 511H1 mixing an output of local oscillator 513FL with an output of bandpass filter 510H1 for conversion into an intermediate frequency, a mixer circuit 511V1 mixing an output of local oscillator 513FH with an output of bandpass filter 510V1 for conversion into an intermediate frequency, and a mixer circuit 514A mixing an output of mixer circuit 511H1 with an output of mixer circuit 511V1.

LNB 500 further includes a bandpass filter 510H2 removing an image signal from an output of LNA 505H2 and a bandpass filter 510V2 removing an image signal from an output of LNA 505V2.

LNB 500 further includes a mixer circuit 511H2 mixing an output of local oscillator 513FL with an output of bandpass filter 510H2 for conversion into an intermediate frequency, a mixer circuit 511V2 mixing an output of local oscillator 513FH with an output of bandpass filter 510V2 for conversion into an intermediate frequency, and a mixer circuit 514B mixing an output of mixer circuit 511H2 with an output of mixer circuit 511V2.

LNB 500 further includes a switch IC519 switching outputs of mixer circuits 514A and 514B, intermediate frequency amplifiers 515A and 515B each amplifying an intermediate frequency signal supplied from switch IC519, a capacitor 517A for transmitting an output of intermediate frequency amplifier 515A to a terminal 534A, and a capacitor 517B for transmitting an output of intermediate frequency amplifier 515B to a terminal 534B.

Switch IC 519 supplies one of the output of mixer circuit 514A and the output of mixer circuit 514B to intermediate frequency amplifier 515A.

Similarly, switch IC519 can also select one of the outputs of mixer circuits 514A and 514B to apply a selected one to intermediate frequency amplifier 515B. Therefore, both of terminals 534A and 534B can output a signal from either of two satellites to the indoor tuner.

LNB 500 further includes a power supply circuit 536. Power supply circuit 536 includes a voltage regulator 538 receiving DC power supply voltage VS1 to stabilize the same and output voltage VO1, an output voltage regulator 540 down-converting and further stabilizing the output of voltage regulator 538 to output voltage VO2 to local oscillator circuit 513, and a multi-output voltage regulator 542 receiving DC voltage VS2 from local oscillator circuit 513 to supply the stabilized voltage to LNA 505. It is noted that voltage VS1 can be obtained from terminals 534A and 534B by interposing a choke coil for preventing transmittance of a high frequency signal and a diode for preventing a back-flow.

Also in the configuration shown in FIG. 9, output voltage regulator 540, local oscillator circuit 513, multi-output voltage regulator 542, and LNA 505 are connected in series on the path on which the power supply current flows. Therefore, the adjustment potential difference in output voltage regulators 540 and 542 can be kept small to reduce a power loss. Accordingly, an LNB with a reduced power consumption can be realized.

Although in the foregoing embodiments the power supply from the local oscillator to LNA has been described, power may be supplied from LNA through the voltage regulator to the local oscillator. The following embodiment will be described based on a modification for power to be supplied from LNA to a local oscillator via a voltage regulator.

Seventh Embodiment

A seventh embodiment is a modification of the configuration of the first embodiment, wherein power is supplied from LNA to a local oscillator via a voltage regulator.

Figure 10:
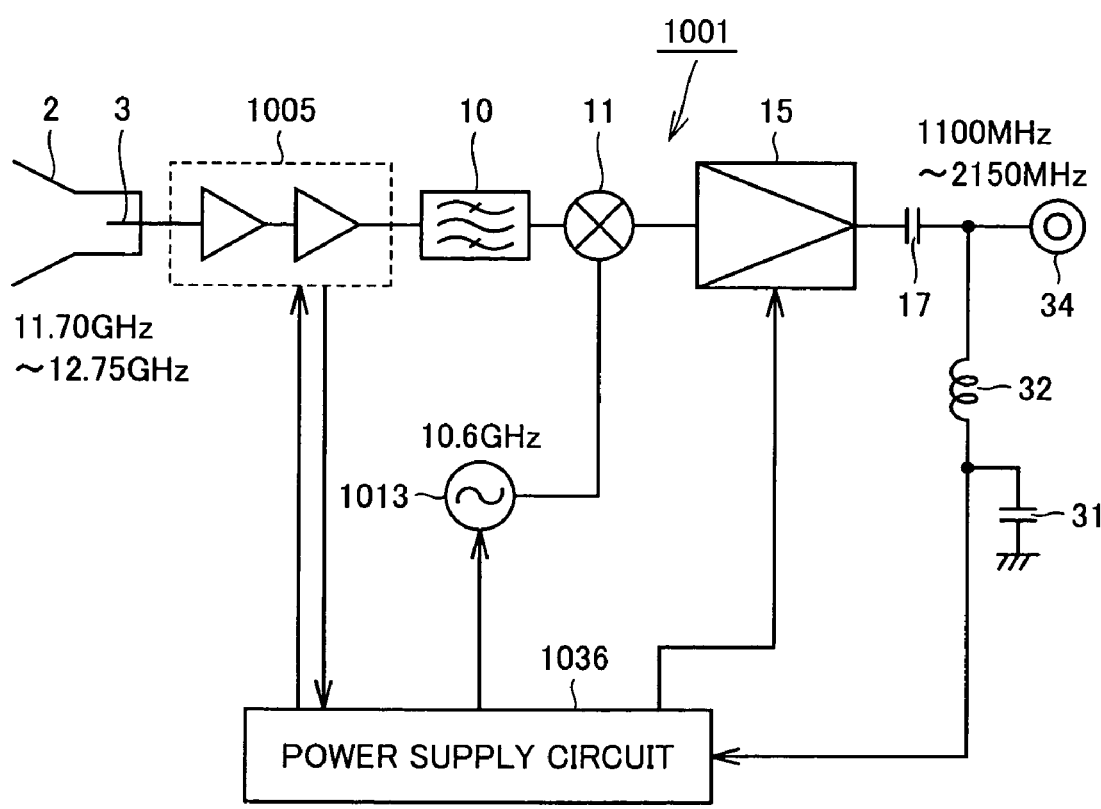
FIG. 10 is a block diagram showing a configuration of an LNB 1001 of a seventh embodiment of the present invention.

FIG. 10 is a block diagram showing a configuration of an LNB 1001 of the seventh embodiment of the present invention.

Referring to FIG. 10, LNB 1001 includes feed horn 2 receiving a broadcast signal transmitted from a satellite, antenna probe 3 arranged inside feed horn 2, an LNA 1005 low noise amplifying the signal received from antenna probe 3, bandpass filter 10 limiting a band of an output signal of LNA 1005 to remove a signal of an image frequency band.

LNB 1001 further includes a local oscillator circuit 1013 outputting a local oscillation signal of 10.6 GHz, mixer circuit 11 receiving the local oscillation signal from local oscillator circuit 1013 to mix the local oscillation signal with an output signal of bandpass filter 10, intermediate frequency amplifier 15 amplifying the received signal as converted to the intermediate frequency by mixer circuit 11, and capacitor 17 for transmitting an output of intermediate frequency amplifier 15 to terminal 34.

LNB 1001 further includes choke coil 32 for transmitting a DC voltage supplied from the tuner arranged indoors via terminal 34 and blocking transmittance of an output signal from intermediate frequency amplifier 15, and a power supply circuit 1036 receiving the DC voltage via choke coil 32 to apply necessary power supply current and bias voltage to LNA 1005, local oscillator circuit 1013, and intermediate frequency amplifier 15. Capacitor 31 is connected at a node between choke coil 32 and power supply circuit 1036 for noise elimination.

Unlike the conventional, power supply circuit 1036 supplies current to LNA 1005 and again receives the current flowing out of LNA 1005 to supply the stabilized current to local oscillator circuit 1013. This is different in configuration from LNB 1 shown in FIG. 1.

Figure 11:
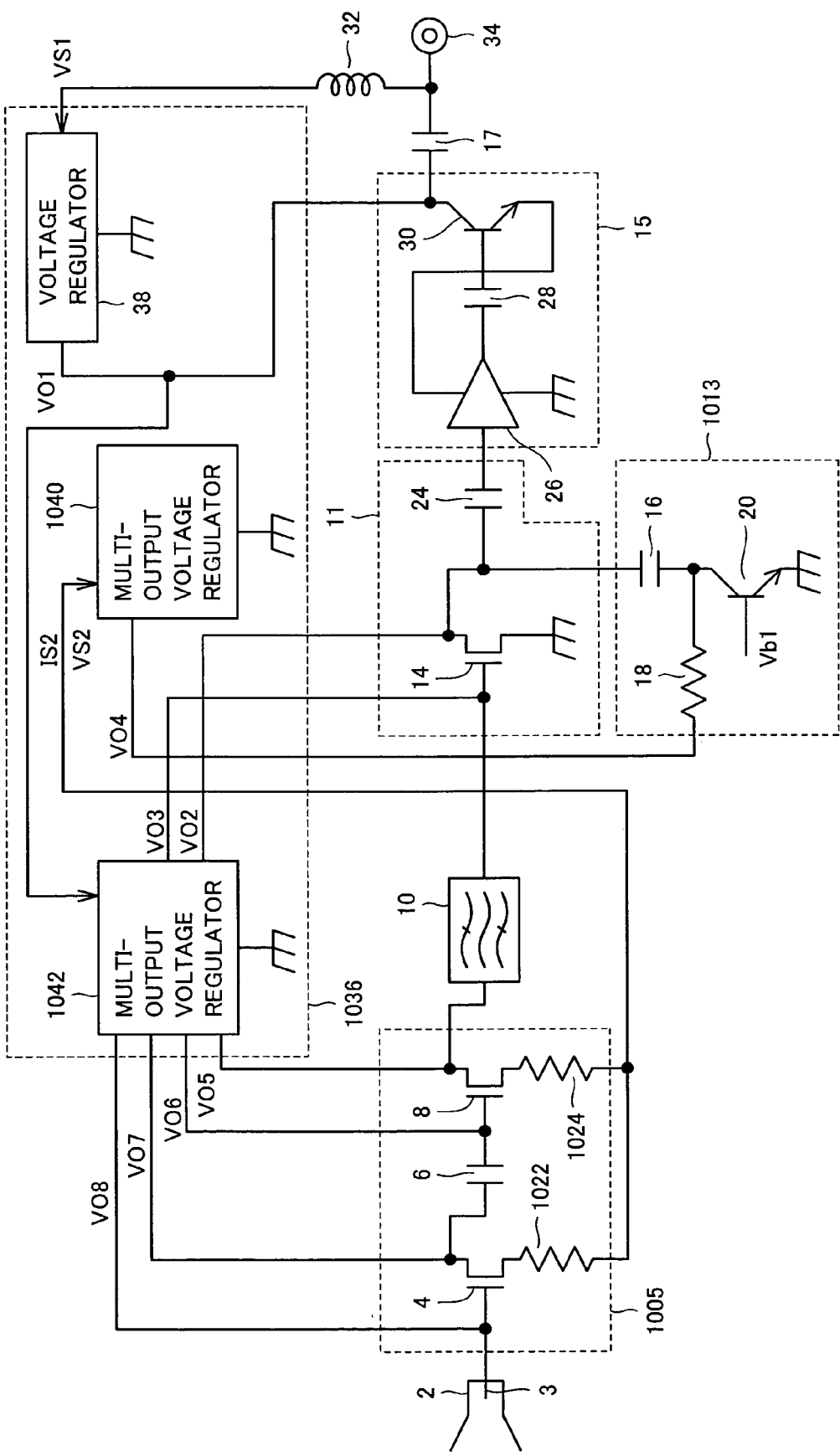
FIG. 11 is a circuit diagram more specifically showing the configuration of LNB 1001 shown in FIG. 10.

FIG. 11 is a circuit more specifically showing the configuration of LNB 1001 shown in FIG. 10.

Referring to FIG. 11, LNA 1005 includes transistors 4 and 8 corresponding to a first-stage amplifier and a second-stage amplifier, respectively, capacitor 6 connected between the drain of transistor 4 and the gate of transistor 8, a resistor 1022 connected in series with transistor 4, and a resistor 1024 connected in series with transistor 6.

Transistor 4 receives at its gate the signal received at antenna probe 3 provided inside feed horn 2. Transistor 4 also receives at its gate DC voltage VO8 as a gate bias potential from power supply circuit 1036. Transistor 4 has its drain receiving DC voltage VO7 from power supply circuit 1036 and has its source connected to one end of resistor 1022, and resistor 1022 has the other end connected to power supply circuit 1036.

Transistor 8 has its gate receiving DC voltage VO6 serving as a bias potential and has its drain receiving DC voltage VO5. Transistor 8 has its source connected to one end of resistor 1024, and resistor 1024 has the other end connected to power supply circuit 1036. Bandpass filter 10 limits the band of the signal output from the drain of transistor 8 to remove a signal of an image frequency band.

Local oscillator circuit 1013 includes resistor 18, capacitor 16 and transistor 20. Resistor 18 has one end receiving DC voltage VO4 from power supply circuit 1036. Resistor 18 has the other end connected to the collector of transistor 20. Transistor 20 has its emitter connected to a ground node.

Mixer circuit 11 includes transistor 14 and capacitor 24. Transistor 14 receives at its gate a signal output from bandpass filter 10 and receives DC voltage VO3 supplied from power supply circuit 1036 as a bias voltage. Transistor 14 receives at its drain DC voltage VO2 from power supply circuit 1036. Transistor 14 has its drain AC-coupled with the collector of transistor 20 through capacitor 16. Therefore, the local oscillation frequency is mixed with the signal of bandpass filter 10 to be output via capacitor 24.

Intermediate frequency amplifier 15 includes a first-stage amplifier 26, transistor 30 for further amplifying an output of amplifier 26, and capacitor 28 coupling the output of amplifier 26 to the base of transistor 30.

Power supply circuit 1036 includes voltage regulator 38 receiving DC voltage VS1 applied from terminal 34 via choke coil 32 to output stabilized DC voltage VO1, a multi-output voltage regulator 1042 receiving DC voltage VO1 to output DC voltages VO2–VO3, VO5–VO8, and a multi-output voltage regulator 1040 outputting DC voltage VO4 stabilized from DC voltage VS2.

The DC voltage output by voltage regulators 1040, 1042 is supplied to the other circuit, serving as a base bias voltage or a voltage for determining an operating point of output of the transistor. Voltage regulators 1040 and 1042 appropriately place current-limiting each of the outputs for an appropriate amplification action in each transistor.

In intermediate frequency amplifier 15, transistor 30 is cascaded to amplifier 26 on the current path. In other words, the current supplied from voltage regulator 38 flows from the collector to the emitter of transistor 30. The current flowing out of the emitter further flows into the power supply node of amplifier 26, passes through amplifier 26 and flows to the ground node.

Such a cascade connection is provided between LNA 1005 and local oscillator circuit 1013. The operating current of LNA 1005 is supplied from the node at which multi-output voltage regulator 1042 outputs DC voltages VO5–VO8, and passes from the drain to the source of each of transistors 4 and 8. The current flowing out of the source is applied through resistor 1022 to the multi-output voltage regulator. This multi-output voltage regulator is supplied with current IS2 and voltage VS2 via resistor 1022. These voltage VS2 and current IS2 are also adjusted in the input circuit portion of voltage regulator 1040. Bias voltage Vbias in the conventional circuit shown in FIG. 21 and bias voltage Vb1 in FIG. 11 are set at the same value.

Multi-output voltage regulator 1040 receives and stabilizes current IS2 and voltage VS2 applied via resistors 1022 and 1024 to output DC voltage VO4 to local oscillator circuit 1013.

It is noted that a stub or choke coil formed of a pattern on a printed circuit board or the like is provided between the output of multi-output voltage regulator 1040 and local oscillator circuit 1013 for blocking a received signal or a local oscillation signal from being transmitted to the output of the multi-output voltage regulator.

Similarly, a stub or choke coil formed of a pattern on a printed circuit board or the like is provided between each output of multi-output voltage regulator 1042 and mixer circuit 11 or LNA for blocking a high-frequency received signal from being transmitted to multi-output voltage regulator 1042. It is noted that such a stub or choke coil is not shown in the drawing for the sake of simplification.

As compared with the conventional technique shown in FIG. 21, multi-output voltage regulator 1040 generates DC voltage VO4 from voltage VS2 lower than DC voltage VO1, so that a stable DC voltage can be generated with less power loss. In the conventional configuration, the sum of the current flowing in local oscillator circuit 913 and the current flowing in LNA 5 accounts for a part of the entire consumption current. With the configuration of the seventh embodiment, if the current flowing in local oscillator circuit 1013 is substantially equal to the current flowing in LNA1005, the consumption current in these portions can be reduced to approximately half in current value.

If there is a difference between the consumption current in local oscillator circuit 1013 and the consumption current in LNA1005, power supply circuit 1036 may include a circuit for sourcing a supplemental current or a current for sinking an excessive current at the node of multi-output voltage regulator 1040 receiving voltage VS2.

Eighth Embodiment

An eighth embodiment is a modification of the configuration of the second embodiment, wherein power is supplied from LNA to a local oscillator via a voltage regulator.

Figure 12:
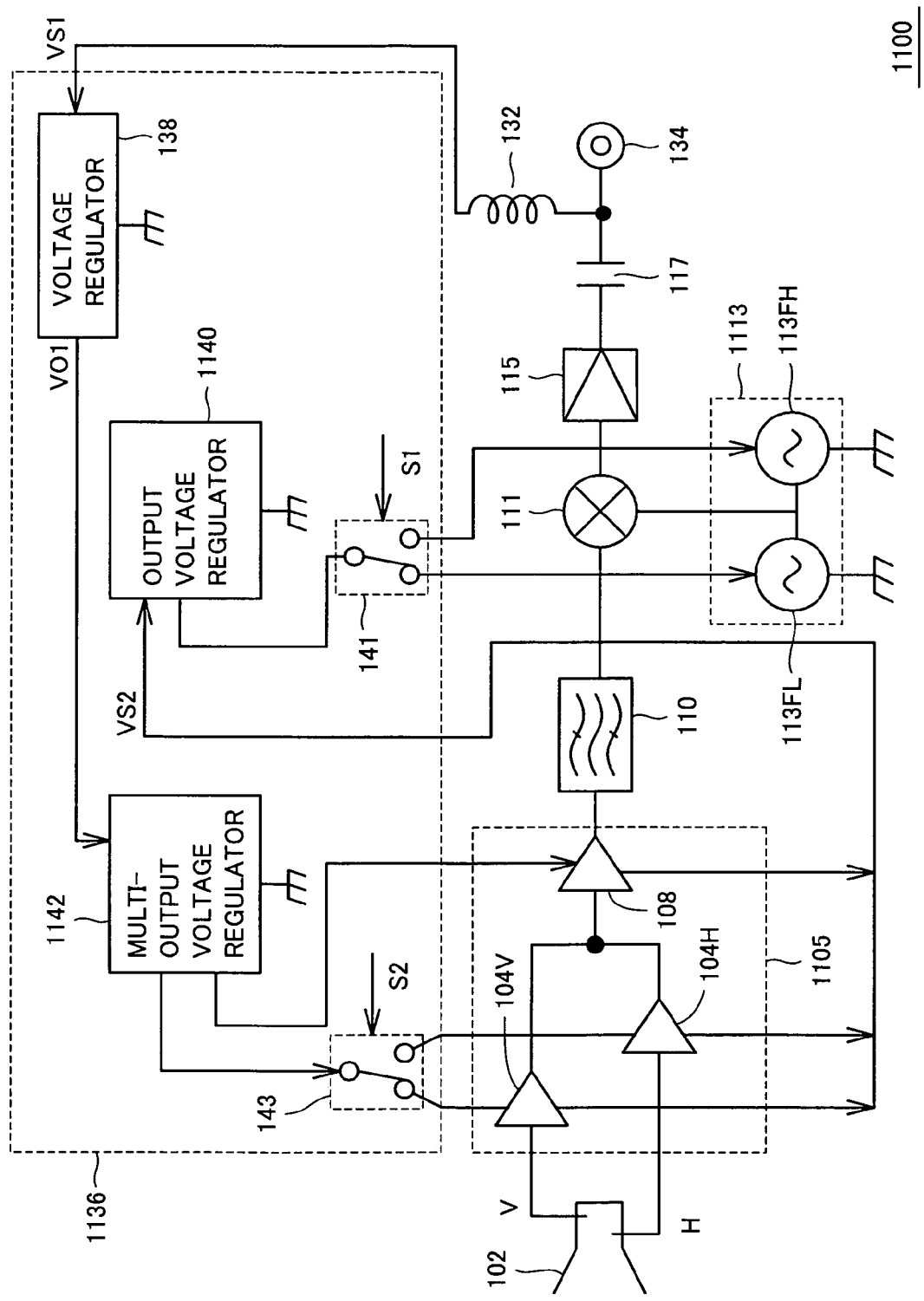
FIG. 12 is a block diagram showing a configuration of an LNB 1100 of an eighth embodiment.

FIG. 12 is a block diagram showing a configuration of an LNB 1100 of the eighth embodiment.

Referring to FIG. 12, LNB 1100 includes feed horn 102, an LNA 1105 selectively amplifying a V polarized wave signal and an H polarized wave signal applied from feed horn 102, bandpass filter 110 limiting a band of an output of LNA 1105, a local oscillator circuit 1113, mixer circuit 111 mixing a local oscillation signal applied from local oscillator circuit 1113 with an output of bandpass filter 110 for conversion into an intermediate frequency, intermediate frequency amplifier 115 amplifying an output of mixer circuit 111, and capacitor 117 coupled between the output of intermediate frequency amplifier 115 and terminal 134.

LNB 1100 further includes choke coil 132 for transmitting a DC voltage applied from the indoor tuner to terminal 134 and a power supply circuit 1136 receiving DC voltage VS1 via choke coil 132 to power LNA 1105 and local oscillator circuit 1113.

LNA 1105 includes amplifier circuit 104V amplifying a V polarized wave, amplifier circuit 104H amplifying an H polarized wave, and amplifier circuit 108 having its input coupled to the outputs of amplifier circuits 104V and 104H.

Local oscillator circuit 1113 includes local oscillator 113FL outputting a first local oscillation signal and local oscillator 113FH outputting a second local oscillation signal having a frequency higher than that of local oscillator 113FL.

Power supply circuit 1136 includes voltage regulator 138 outputting DC voltage VO1 stabilized from DC voltage VS1, a multi-output voltage regulator 1142 receiving the output of voltage regulator 138 to apply the voltage stabilized at an appropriate voltage to LNA 1105, and switch 143 selectively applying the output of multi-output voltage regulator 1142 to one of amplifier circuits 104V and 104H according to select signal S2.

Power supply circuit 1136 further includes an output voltage regulator 1140 receiving DC voltage VS2 from LNA 1105 to stabilize the same and output DC voltage VO2, and switch 141 selectively applying the output voltage of output voltage regulator 1140 to one of local oscillator 113FL and local oscillator 113FH according to select signal S1.

Select signal S2 is controlled based on whether the indoor tuner receives V polarized wave or H polarized wave. Select signal S1 is selected depending on how the output of bandpass filter 110 is frequency-converted, that is, a high frequency or low frequency. Select signals S1 and S2 allow the operating voltage and operating current to be supplied only to a necessary circuit, thereby reducing the consumption current of the LNB.

Furthermore, output voltage regulators 1142 and 1140 are connected in series through LNA on the path on which the power supply current flows, so that the LNB with switching between H and V polarized waves as well as switching of the local oscillator circuit between high and low frequencies also attains less power loss in the power supply circuit, thereby further reducing a power consumption.

Ninth Embodiment

A ninth embodiment is a modification of the configuration of the third embodiment, wherein power is supplied from LNA to a local oscillator via a voltage regulator.

Figure 13:
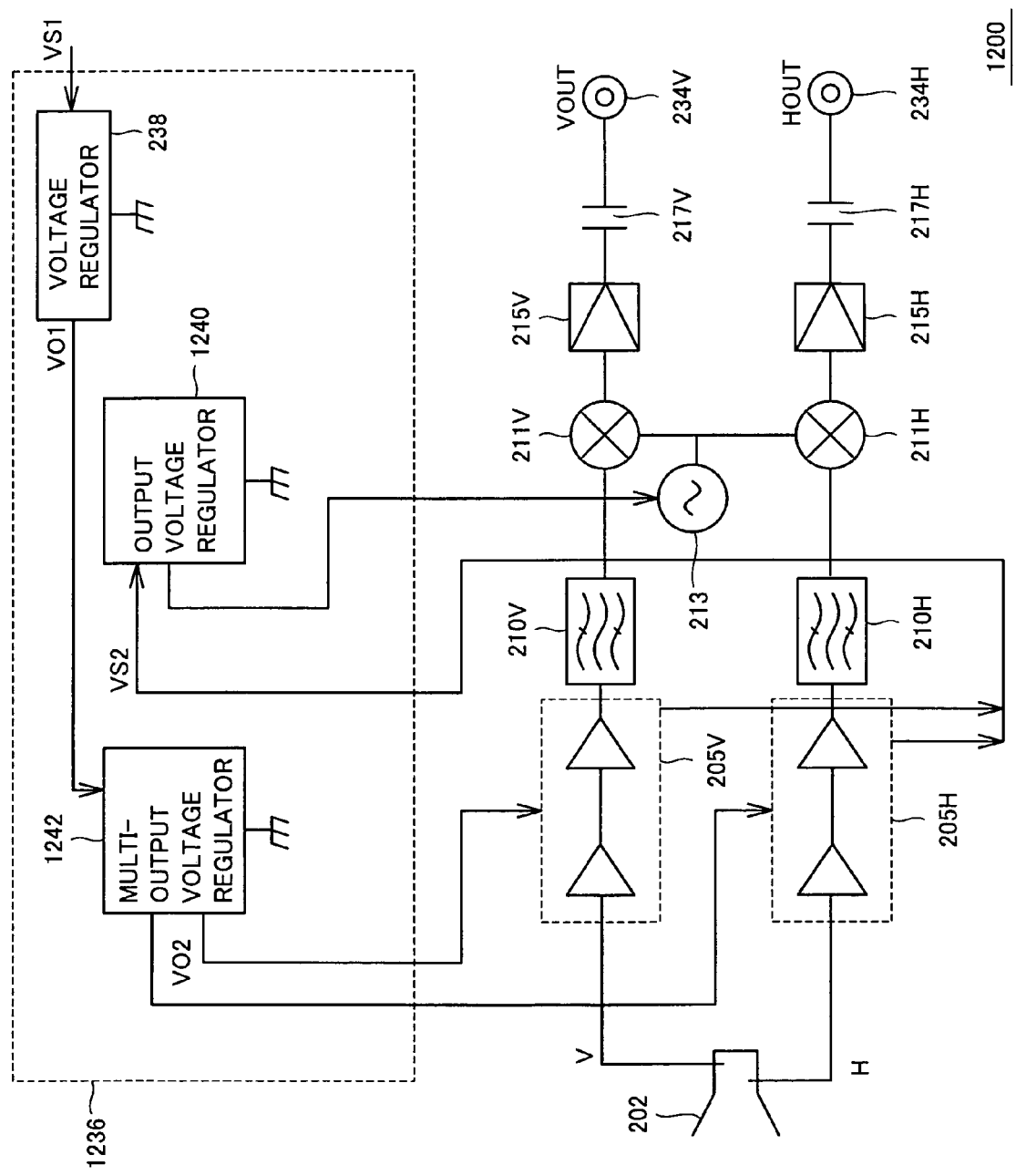
FIG. 13 is a block diagram showing a configuration of an LNB 1200 of a ninth embodiment.

FIG. 13 is a block diagram showing a configuration of an LNB 1200 of the ninth embodiment.

Referring to FIG. 13, LNB 1200 includes feed horn 202 receiving a signal from a satellite, LNA 205V amplifying a V polarized wave signal received by feed horn 202, bandpass filter 210V removing an image signal from an output of LNA 205V, local oscillator 213, mixer circuit 211V mixing a local oscillation signal output by local oscillator 213 with an output of bandpass filter 210V, intermediate frequency amplifier 215V amplifying an IF signal of an intermediate frequency band output from mixer circuit 211V, and capacitor 217V for transmitting an output of intermediate frequency amplifier 215V to terminal 234V.

LNB 1200 further includes LNA 205H amplifying an H polarized wave signal received by feed horn 202, bandpass filter 210H removing an image signal from an output of LNA 205H, mixer circuit 211H mixing a local oscillation signal output by local oscillator 213 with an output of bandpass filter 210H, intermediate frequency amplifier 215H amplifying an IF signal of an intermediate frequency band output from mixer circuit 211H, and capacitor 217H for transmitting an output of intermediate frequency amplifier 215H to terminal 234H.

LNB 1200 further includes a power supply circuit 1236. Power supply circuit 1236 includes voltage regulator 238 receiving DC power supply voltage VS1 to stabilize the same and output voltage VO1, an output voltage regulator 1242 down-converting and further stabilizing the output of voltage regulator 238 to output voltage VO2 to LNA 205V and 205H, and a multi-output voltage regulator 1240 receiving DC voltage VS2 from LNA 205V and 205H to supply the stabilized voltage to local oscillator 213. It is noted that voltage VS1 can be obtained from two terminals by interposing respective backflow-preventing diodes for terminals 234V and 234H.

In the configuration shown in FIG. 13, LNA 205V and 205H as well as local oscillator 213 continuously operate, and terminals 234V and 234H output a signal converted from V polarized wave and a signal converted from H polarized wave, respectively.

Figure 14:
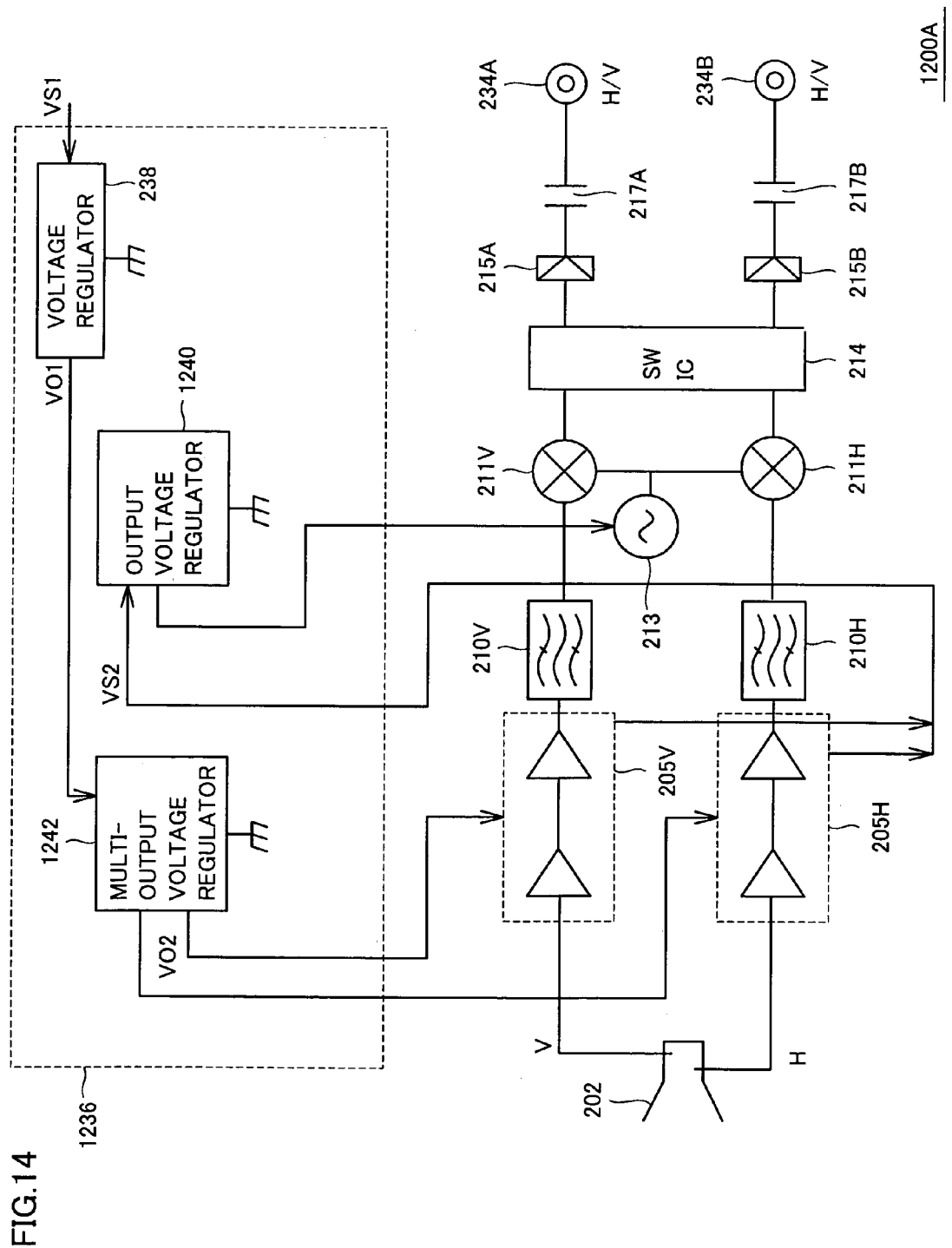
FIG. 14 is a diagram showing a modification of LNB1200 shown in FIG. 13.

FIG. 14 is a diagram showing a modification of LNB 1200 shown in FIG. 13.

Referring to FIG. 14, an LNB 1200A has the same configuration as LNB 1200 shown in FIG. 13 except that intermediate frequency amplifiers 215V and 215H, capacitors 217V and 217H as well as terminals 234V and 234H are replaced with switch IC (integrated circuit) 214, intermediate frequency amplifiers 215A and 215B, capacitors 217A and 217B as well as terminals 234A and 234B. The configuration of the other portion of LNB 1200A is similar to that of LNB 1200 described with reference to FIG. 13, and therefore the description thereof will not be repeated.

LNB 1200A uses internal switching in switch IC214 to allow any one of outputs of mixer circuits 211V and 211H to be applied to intermediate frequency amplifier 215A. Therefore, terminal 234A can output either of the signal converted from H polarized wave and the signal converted from V polarized wave.

Similarly, LNB 1200A also uses internal switching in switch IC214 to allow the outputs of mixer circuits 211V and 211H to be selectively output to intermediate frequency amplifier 215B. Terminal 234B can also output either of the signal converted from H polarized wave and the signal converted from V polarized wave.

Also in the configuration shown in FIGS. 13 and 14, output voltage regulator 1242, LNA 205V and 205H, multi-output voltage regulator 1240 and the local oscillator are connected in series on the path on which the power supply current flows. Therefore, the adjustment potential difference in output voltage regulators 1240 and 1242 can be kept small to reduce a power loss. Accordingly, an LNB with a reduced power consumption can be realized.

Tenth Embodiment

A tenth embodiment is a modification of the configuration of the fourth embodiment, wherein power is supplied from LNA to a local oscillator via a voltage regulator.

Figure 15:
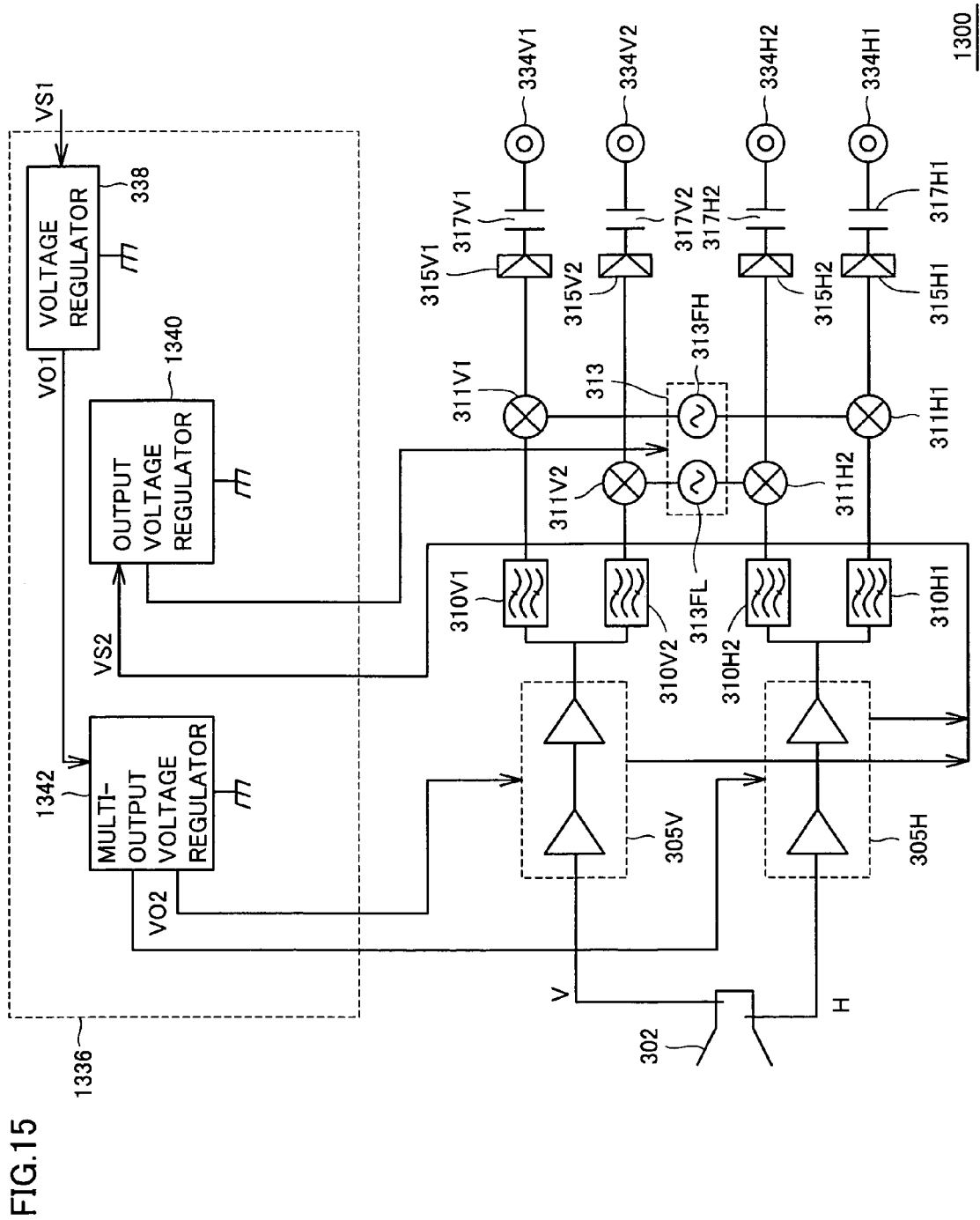
FIG. 15 is a block diagram showing a configuration of an LNB 1300 of a tenth embodiment.

FIG. 15 is a block diagram showing a configuration of an LNB 1300 of the tenth embodiment.

Referring to FIG. 15, LNB 1300 includes feed horn 302, LNA 305V amplifying a V polarized wave received by feed horn 302, bandpass filters 310V1 and 310V2 each removing an image signal from an output of LNA 305V, and local oscillator circuit 313.

Local oscillator circuit 313 includes local oscillator 313FH and local oscillator 313FL outputting an oscillation signal having a frequency lower than that of local oscillator 313FH.

LNB 1300 further includes mixer circuit 311V1 mixing an output of local oscillator 313FH with an output of bandpass filter 310V1 for conversion into an intermediate frequency, intermediate frequency amplifier 315V1 amplifying the intermediate frequency output by mixer circuit 311V1, and capacitor 317V1 for transmitting an output of intermediate frequency amplifier 315V1 to terminal 334V1.

LNB 1300 further includes mixer circuit 311V2 mixing an output of local oscillator 313FL with an output of bandpass filter 310V2 for conversion into an intermediate frequency, intermediate frequency amplifier 315V2 amplifying the intermediate frequency output by mixer circuit 311V2, and capacitor 317V2 for transmitting an output of intermediate frequency amplifier 315V2 to terminal 334V2.

LNB 1300 further includes LNA 305H amplifying an H polarized wave received by feed horn 302, bandpass filters. 310H1 and 310H2 each removing an image signal from an output of LNA 305H, and local oscillator circuit 313.

LNB 1300 further includes mixer circuit 311H2 mixing an output of local oscillator 313FL with an output of bandpass filter 310H2 for conversion into an intermediate frequency, intermediate frequency amplifier 315H2 amplifying the intermediate frequency output by mixer circuit 311H2, and capacitor 317H2 for transmitting an output of intermediate frequency amplifier 315H2 to terminal 334H2.

LNB 1300 further includes mixer circuit 311H1 mixing an output of local oscillator 313FH with an output of bandpass filter 310H1 for conversion into an intermediate frequency, intermediate frequency amplifier 315H1 amplifying the intermediate frequency output by mixer circuit 311H1, and capacitor 317H1 for transmitting an output of intermediate frequency amplifier 315H1 to terminal 334H1.

LNB 1300 further includes a power supply circuit 1336. Power supply circuit 1336 includes voltage regulator 338 receiving DC power supply voltage VS1 to stabilize the same and output voltage VO1, an output voltage regulator 1342 down-converting and further stabilizing the output of voltage regulator 338 to output voltage VO2 to LNA 305V and 305H, and a multi-output voltage regulator 1340 receiving DC voltage VS2 from LNA 305V and 305H to supply the stabilized voltage to local oscillator 313FH. It is noted that voltage VS1 is obtained from four terminals by interposing respective backflow-preventing diodes for terminals 334V1, 334H1, 334V2, and 334H2.

Figure 16:
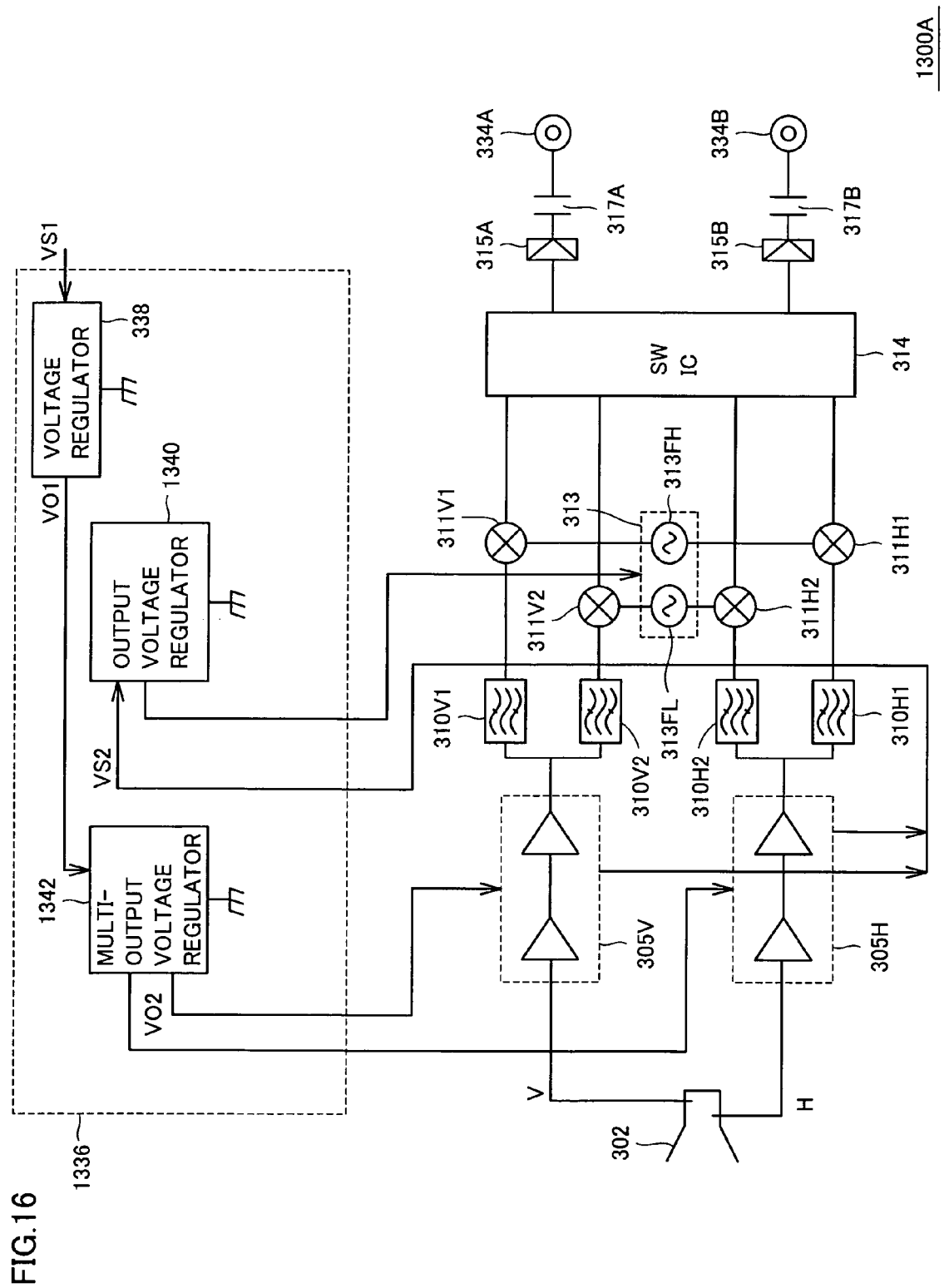
FIG. 16 is a diagram showing a modification of the LNB shown in FIG. 15.

FIG. 16 is a diagram showing a modification of the LNB shown in FIG. 15.

Referring to FIG. 16, an LNB 1300A has the same configuration as LNB 1300 except that intermediate frequency amplifiers 315V1, 315V2, 315H2, and 315H1, capacitors 317V1, 317V2, 317H2, and 317H1 as well as terminals 334V1, 334V2, 334H2, and 334H1 are replaced with switch IC314, intermediate frequency amplifiers 315A and 315B, capacitors 317A and 317B as well as terminals 334A and 334B. The configuration of the other portion of LNB 1300A is similar to that of LNB 1300 described with reference to FIG. 15, and therefore description thereof will not be repeated.

Switch IC314 can select one of the outputs of four mixer circuits 311V1, 311V2, 311H2, and 311H1 to supply a selected one to intermediate frequency amplifier 315A. Similarly, switch IC314 can select one of the outputs of the four mixer circuits to apply a selected one to intermediate frequency amplifier 315B. Therefore, both of terminal 334A and terminal 334B each can output four kinds of signals.

Also in the configuration shown in FIGS. 15 and 16, output voltage regulator 1342, LNA 305V and 305H, multi-output voltage regulator 1340 and local oscillator circuit 313FH are connected in series on the path on which the power supply current flows. Therefore, the adjustment potential difference in output voltage regulators 1342 and 1340 can be kept small to reduce a power loss. Accordingly, an LNB with a reduced power consumption can be realized.

Eleventh Embodiment

An eleventh embodiment is a modification of the configuration of the fifth embodiment, wherein power is supplied from LNA to a local oscillator via a voltage regulator.

Figure 17:
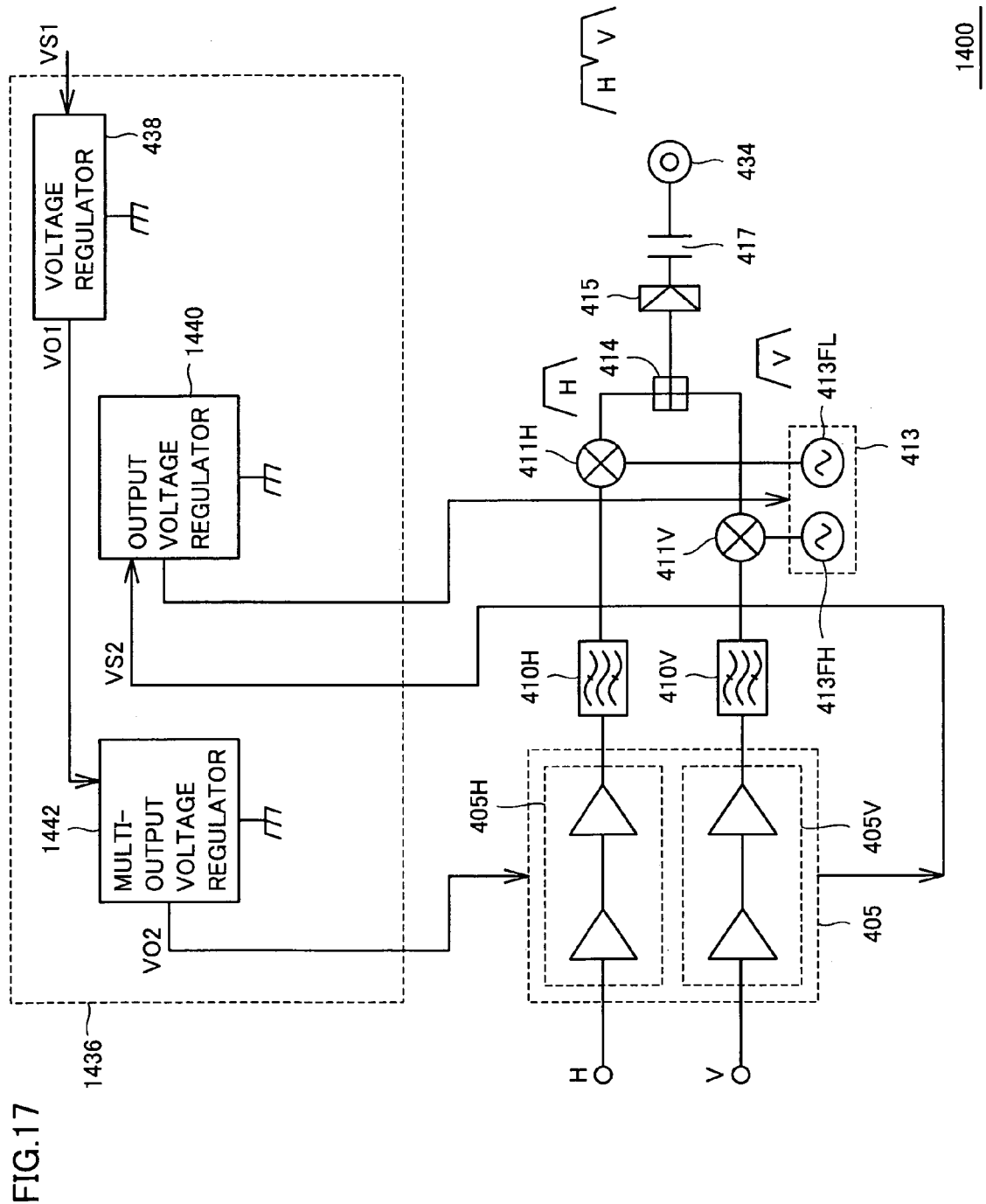
FIG. 17 is a block diagram showing a configuration of an LNB 1400 of an eleventh embodiment.

FIG. 17 is a block diagram showing a configuration of an LNB 1400 of the eleventh embodiment.

LNB 1400 shown in FIG. 17 is a band stack type LNB. The band stack type LNB is an LNB for frequency-converting a plurality of received signals of H polarized wave and V polarized wave such that they are not overlapped in the intermediate frequency band to transmit the signals indoors via one signal cable.

LNB 1400 includes LNA 405 including LNA 405H amplifying the H polarized wave and LNA 405V amplifying the V polarized wave.

LNB 1400 further includes bandpass filter 410H removing an image signal from an output of LNA 405H, bandpass filter 410V removing an image signal from an output of LNA 405V, and local oscillator circuit 413.

Local oscillator circuit 413 includes local oscillator 413FH and local oscillator 413FL outputting an oscillation signal having a frequency lower than that of local oscillator 413FH.

LNB 1400 further includes mixer circuit 411H mixing an output of local oscillator 413FL with an output of bandpass filter 410H for conversion into an intermediate frequency, mixer circuit 411V mixing an output of local oscillator 413FH with an output of bandpass filter 410V for conversion into an intermediate frequency, mixer circuit 414 mixing an output of mixer circuit 411H with an output of mixer circuit 411V, intermediate frequency amplifier 415 amplifying an output of mixer circuit 414, and capacitor 417 for transmitting an output of intermediate frequency amplifier 415 to terminal 434.

LNB 1400 further includes a power supply circuit 1436. Power supply circuit 1436 includes voltage regulator 438 receiving DC power supply voltage VS1 to stabilize the same and output voltage VO1, an output voltage regulator 1442 down-converting and further stabilizing the output of voltage regulator 438 to output voltage VO2 to LNA 405V and 405H, and a multi-output voltage regulator 1440 receiving DC voltage VS2 from LNA 405V and 405H to supply the stabilized voltage to local oscillator circuit 413. It is noted that voltage VS1 can be obtained from terminal 434 by interposing a choke coil for blocking transmittance of a high frequency signal.

Also in the configuration shown in FIG. 17, output voltage regulator 1442, LNA 405V and 405H, multi-output voltage regulator 1440, and local oscillator circuit 413 are connected in series on the path on which the power supply current flows. Therefore, the adjustment potential difference in output voltage regulators 1440 and 1442 can be kept small to reduce a power loss. Accordingly, an LNB with a reduced power consumption can be realized.

Twelfth Embodiment

A twelfth embodiment is a modification of the configuration of the sixth embodiment, wherein power is supplied from LNA to a local oscillator via a voltage regulator.

Figure 18:
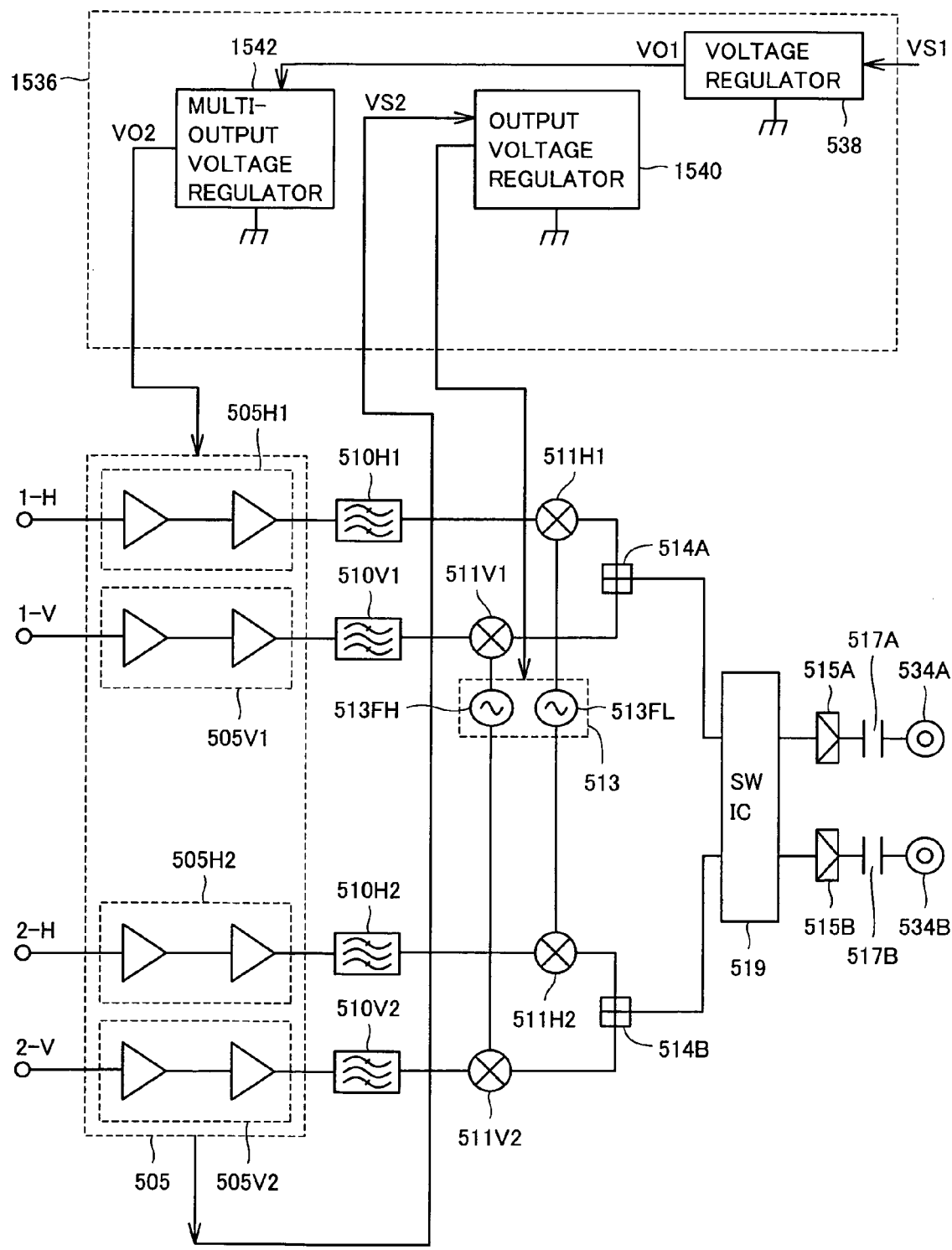
FIG. 18 is a block diagram showing a configuration of an LNB 1500 of a twelfth embodiment.
Figure 19:
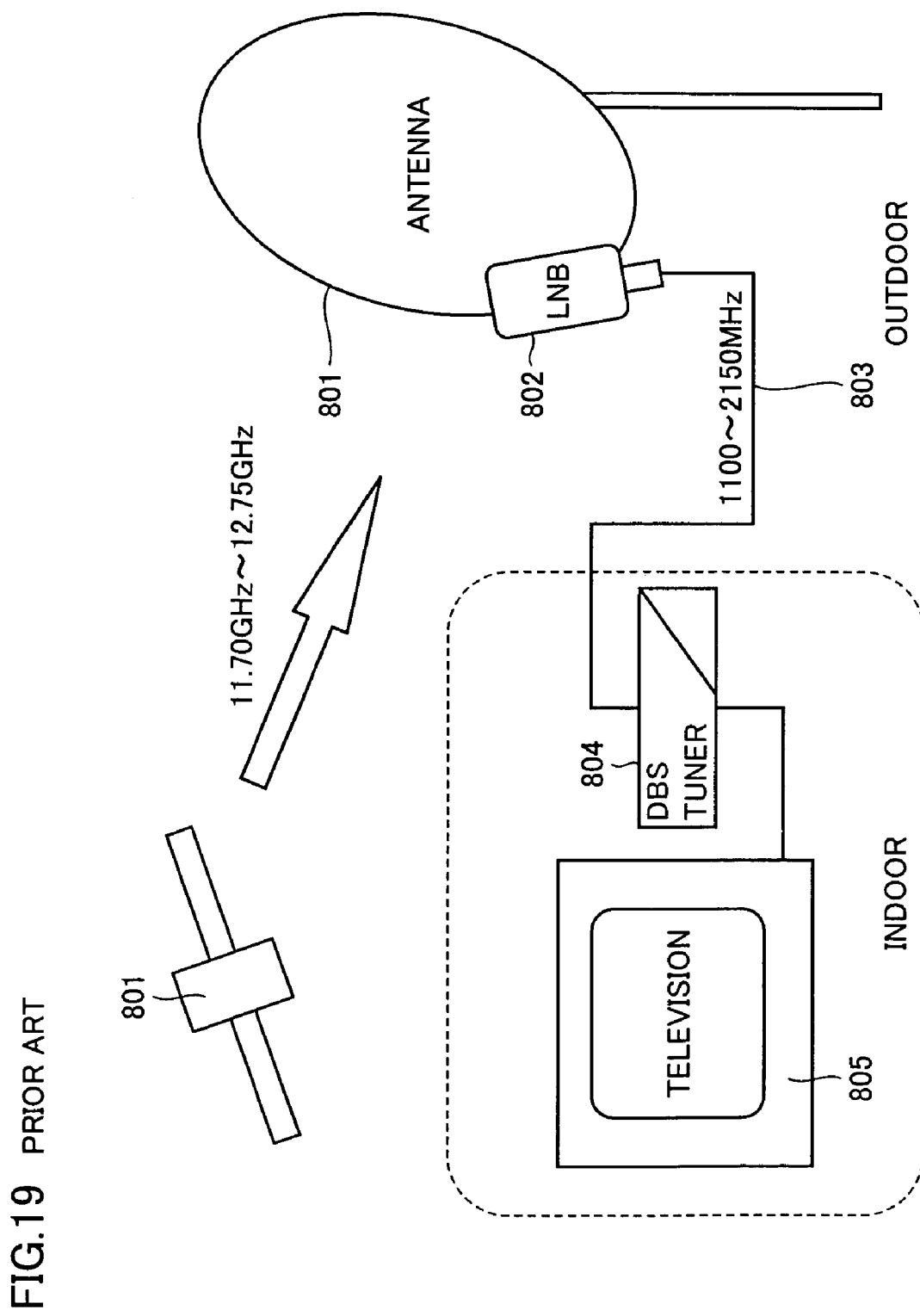
FIG. 19 is a block diagram showing a conventional satellite broadcast receiving system.
Figure 20:
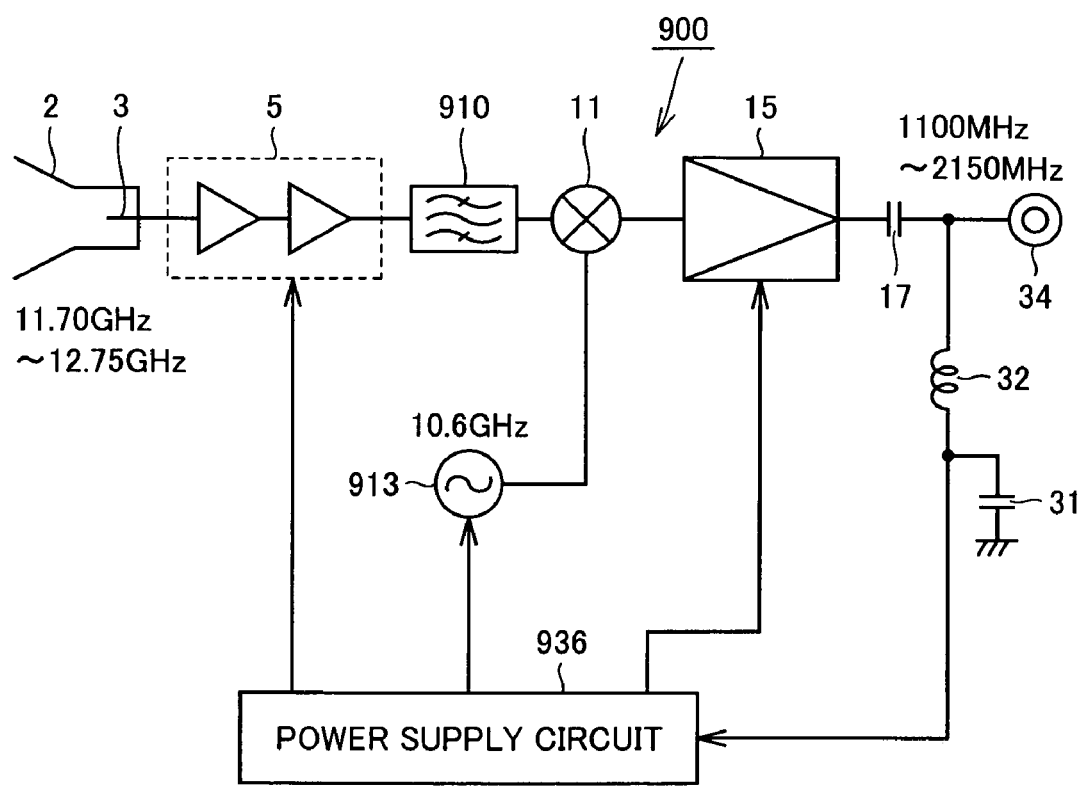
FIG. 20 is a block diagram of an LNB shown in FIG. 19.

FIG. 18 is a block diagram showing a configuration of an LNB 1500 of the twelfth embodiment.

Referring to FIG. 18, LNB 1500 includes LNA 505. LNA 505 includes LNA 505H1 amplifying an H polarized wave of a first satellite, LNA 505V1 amplifying a V polarized wave of the first satellite, LNA 505H2 amplifying an H polarized wave of a second satellite, and LNA 505V2 amplifying a V polarized wave of the second satellite.

LNB 1500 further includes bandpass filter 510H1 removing an image signal from an output of LNA 505H1, bandpass filter 510V1 removing an image signal from an output of LNA 505V1, and local oscillator circuit 513.

Local oscillator circuit 513 includes local oscillator 513FH and local oscillator 513FL outputting an oscillation signal having a frequency lower than that of local oscillator 513FH.

LNB 1500 further includes mixer circuit 511H1 mixing an output of local oscillator 513FL with an output of bandpass filter 510H1 for conversion into an intermediate frequency, mixer circuit 511V1 mixing an output of local oscillator 513FH with an output of bandpass filter 510V1 for conversion into an intermediate frequency, and mixer circuit 514A mixing an output of mixer circuit 511H1 with an output of mixer circuit 511V1.

LNB 1500 further includes bandpass filter 510H2 removing an image signal from an output of LNA 505H2 and bandpass filter 510V2 removing an image signal from an output of LNA 505V2.

LNB 1500 further includes mixer circuit 511H2 mixing an output of local oscillator 513FL with an output of bandpass filter 510H2 for conversion into an intermediate frequency, mixer circuit 511V2 mixing an output of local oscillator 513FH with an output of bandpass filter 510V2 for conversion into an intermediate frequency, and mixer circuit 514B mixing an output of mixer circuit 511H2 with an output of mixer circuit 511V2.

LNB 1500 further includes switch IC519 switching outputs of mixer circuits 514A and 514B, intermediate frequency amplifiers 515A and 515B each amplifying an intermediate frequency signal applied from switch IC 519, capacitor 517A for transmitting an output of intermediate frequency amplifier 515A to terminal 534A, and capacitor 517B for transmitting an output of intermediate frequency amplifier 515B to terminal 534B.

Switch IC519 supplies one of the output of mixer circuit 514A and the output of mixer circuit 514B to intermediate frequency amplifier 515A.

Similarly, switch IC 519 can also select one of the outputs of mixer circuits 514A and 514B to supply a selected one to intermediate frequency amplifier 515B. Therefore, both of terminals 534A and 534B can output a signal from either of the two satellites to the indoor tuner.

LNB 1500 further includes a power supply circuit 1536. Power supply circuit 1536 includes voltage regulator 538 receiving DC power supply voltage VS1 to stabilize the same and output voltage VO1, an output voltage regulator 1542 down-converting and further stabilizing the output of voltage regulator 538 to output voltage VO2 to LNA 505, and a multi-output voltage regulator 1540 receiving DC voltage VS2 from LNA 505 to supply the stabilized voltage to local oscillator circuit 513. It is noted that voltage VS1 can be obtained from terminals 534A and 534B by interposing a choke coil for blocking transmittance of a high frequency signal and a diode for preventing a backflow.

Also in the configuration shown in FIG. 18, output voltage regulator 1542, LNA 505, multi-output voltage regulator 1540, and local oscillator circuit 513 are connected in series on the path on which the power supply current flows. Therefore, the adjustment potential difference in output voltage regulators 1542 and 1540 can be kept small to reduce a power loss. Accordingly, an LNB with a reduced power consumption can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low noise block down converter comprising:
   a signal reception unit receiving a broadcast signal transmitted from a first satellite to output a first RF signal;
   a local oscillator circuit receiving a supply of power supply current from a high potential node to discharge said power supply current from a low potential node;
   a frequency converter converting said first RF signal into a first IF signal of an intermediate frequency band using an output signal of said local oscillator circuit;
   an output port for outputting said first IF signal; and
   a power supply circuit supplying power to said local oscillator circuit and said first signal reception unit, wherein
   said power supply circuit includes
   a first voltage regulator receiving a power supply via said output port to perform a voltage adjustment and applying a first DC voltage to said high potential node of said local oscillator circuit, and
   a second voltage regulator receiving a potential at said low potential node of said local oscillator circuit to perform a voltage adjustment and applying a second DC voltage to said signal reception unit.

2. The low noise block down converter according to claim 1, wherein
   said local oscillator circuit includes a plurality of local oscillators respectively outputting a plurality of local oscillation signals.

3. The low noise block down converter according to claim 2, wherein
   said power supply circuit includes a switch selectively supplying said first DC voltage to said plurality of local oscillators.

4. The low noise block down converter according to claim 1, wherein
   said signal reception unit includes a plurality of low noise amplifiers respectively receiving a plurality of broadcast signals.

5. The low noise block down converter according to claim 4, wherein
said power supply circuit includes a switch selectively supplying said second DC voltage to said plurality of low noise amplifiers.

6. The low noise block down converter according to claim 1, wherein
said local oscillator circuit includes a transistor receiving a base bias voltage that is higher than an output target voltage of said second voltage regulator at least by a base-emitter voltage.

7. A low noise block down converter comprising:
a signal reception unit receiving a supply of power supply current from a high potential node to discharge said power supply current from a low potential node and receiving a broadcast signal transmitted from a first satellite to output a first RF signal;
a local oscillator circuit;
a frequency converter converting said first RF signal into a first IF signal of an intermediate frequency band using an output signal of said local oscillator circuit;
an output port for outputting said first IF signal; and
a power supply circuit supplying power to said local oscillator circuit and said first signal reception unit, wherein
said power supply circuit includes
a first voltage regulator receiving a power supply via said output port to perform a voltage adjustment and applying a first DC voltage to said high potential node of said signal reception unit, and
a second voltage regulator receiving a potential at said low potential node of said signal reception unit to perform a voltage adjustment and applying a second DC voltage as a power supply voltage to said local oscillator circuit.

8. The low noise block down converter according to claim 7, wherein
said local oscillator circuit includes a plurality of local oscillators respectively outputting a plurality of local oscillation signals.

9. The low noise block down converter according to claim 8, wherein
said power supply circuit includes a switch selectively supplying said second DC voltage to said plurality of local oscillators.

10. The low noise block down converter according to claim 7, wherein
said signal reception unit includes a plurality of low noise amplifiers respectively receiving a plurality of broadcast signals.

11. The low noise block down converter according to claim 10, wherein
said power supply circuit includes a switch selectively supplying said first DC voltage to said plurality of low noise amplifiers.

12. The low noise block down converter according to claim 7, wherein
said local oscillator circuit includes a transistor receiving a base bias voltage that is higher than that of a ground node at least by a base-emitter voltage.

* * * * *